US009691685B2

(12) United States Patent
Lee et al.

(10) Patent No.: US 9,691,685 B2
(45) Date of Patent: Jun. 27, 2017

(54) SEMICONDUCTOR DEVICES AND METHODS OF MANUFACTURING THE SAME, AND SEMICONDUCTOR PACKAGES INCLUDING THE SEMICONDUCTOR DEVICES

(71) Applicant: Samsung Electronics Co., Ltd., Suwon-si (KR)

(72) Inventors: Kyu-Ha Lee, Yongin-si (KR); Hyung-Jun Jeon, Yongsan-gu (KR); Jum-Yong Park, Yongin-si (KR); Byung-Lyul Park, Seoul (KR); Ji-Soon Park, Suwon-si (KR); Jin-Ho An, Seoul (KR); Jin-Ho Chun, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/163,995

(22) Filed: May 25, 2016

(65) Prior Publication Data

US 2017/0033032 A1    Feb. 2, 2017

(30) Foreign Application Priority Data

Jul. 28, 2015    (KR) ........................ 10-2015-0106828

(51) Int. Cl.
*H01L 23/544* (2006.01)
*H01L 23/48* (2006.01)
(Continued)

(52) U.S. Cl.
CPC ...... *H01L 23/481* (2013.01); *H01L 21/76852* (2013.01); *H01L 21/76898* (2013.01);
(Continued)

(58) Field of Classification Search
CPC ..... H01L 23/481; H01L 23/544; H01L 24/02; H01L 24/13; H01L 23/53238; H01L 23/53223; H01L 23/53266; H01L 21/76898; H01L 21/76852; H01L 21/78; H01L 2224/13147; H01L 2223/5446; H01L 2224/02372; H01L 2224/0239;
(Continued)

(56) References Cited

U.S. PATENT DOCUMENTS 6,521,975 B1 *  2/2003  West ..................... H01L 23/562
                                                      257/508
6,534,387 B1    3/2003  Shinogi et al.
(Continued)

FOREIGN PATENT DOCUMENTS

| JP | 2013120767 | 6/2013 |
| JP | 2014033161 | 2/2014 |
| KR | 1020100089233 | 8/2010 |

*Primary Examiner* — Victor A Mandala
(74) *Attorney, Agent, or Firm* — Onello & Mello LLP

(57) ABSTRACT

A semiconductor device includes a substrate having a die region and a scribe region surrounding the die region, a plurality of via structures penetrating through the substrate in the die region, a portion of the via structure being exposed over a surface of the substrate, and a protection layer pattern structure provided on the surface of the substrate surrounding a sidewall of the exposed portion of the via structure and having a protruding portion covering at least a portion of the scribe region adjacent to the via structure.

20 Claims, 36 Drawing Sheets

(51) Int. Cl.
*H01L 23/00* (2006.01)
*H01L 23/532* (2006.01)
*H01L 21/768* (2006.01)
*H01L 21/78* (2006.01)

(52) U.S. Cl.
CPC ........ *H01L 21/78* (2013.01); *H01L 23/53223* (2013.01); *H01L 23/53238* (2013.01); *H01L 23/53266* (2013.01); *H01L 23/544* (2013.01); *H01L 24/02* (2013.01); *H01L 24/13* (2013.01); *H01L 2223/5446* (2013.01); *H01L 2224/0239* (2013.01); *H01L 2224/02372* (2013.01); *H01L 2224/13024* (2013.01); *H01L 2224/13139* (2013.01); *H01L 2224/13147* (2013.01); *H01L 2924/01029* (2013.01); *H01L 2924/01047* (2013.01)

(58) Field of Classification Search
CPC . H01L 2924/01047; H01L 2924/01029; H01L 2224/13024; H01L 2224/13139
See application file for complete search history.

(56) References Cited

U.S. PATENT DOCUMENTS

| | | | |
|---|---|---|---|
| 6,703,287 | B2 | 3/2004 | Fujishi et al. |
| 6,730,931 | B2 | 5/2004 | Cleeves et al. |
| 6,818,550 | B2 | 11/2004 | Shibata |
| 8,836,084 | B2 | 9/2014 | Chen et al. |
| 8,860,208 | B2 | 10/2014 | Chen et al. |
| 2006/0076651 | A1* | 4/2006 | Tsutsue ................ H01L 23/564 257/620 |
| 2007/0096329 | A1 | 5/2007 | Suzuki et al. |
| 2009/0108409 | A1* | 4/2009 | Tsutsue ................ H01L 21/768 257/618 |
| 2011/0049657 | A1* | 3/2011 | Tsukamoto ........... H01L 27/105 257/421 |
| 2011/0073974 | A1* | 3/2011 | Takano ................. H01L 21/78 257/432 |
| 2013/0221493 | A1* | 8/2013 | Kim ..................... H01L 23/481 257/620 |
| 2013/0334656 | A1* | 12/2013 | Jin ..................... H01L 23/5256 257/529 |

* cited by examiner

FIG. 3
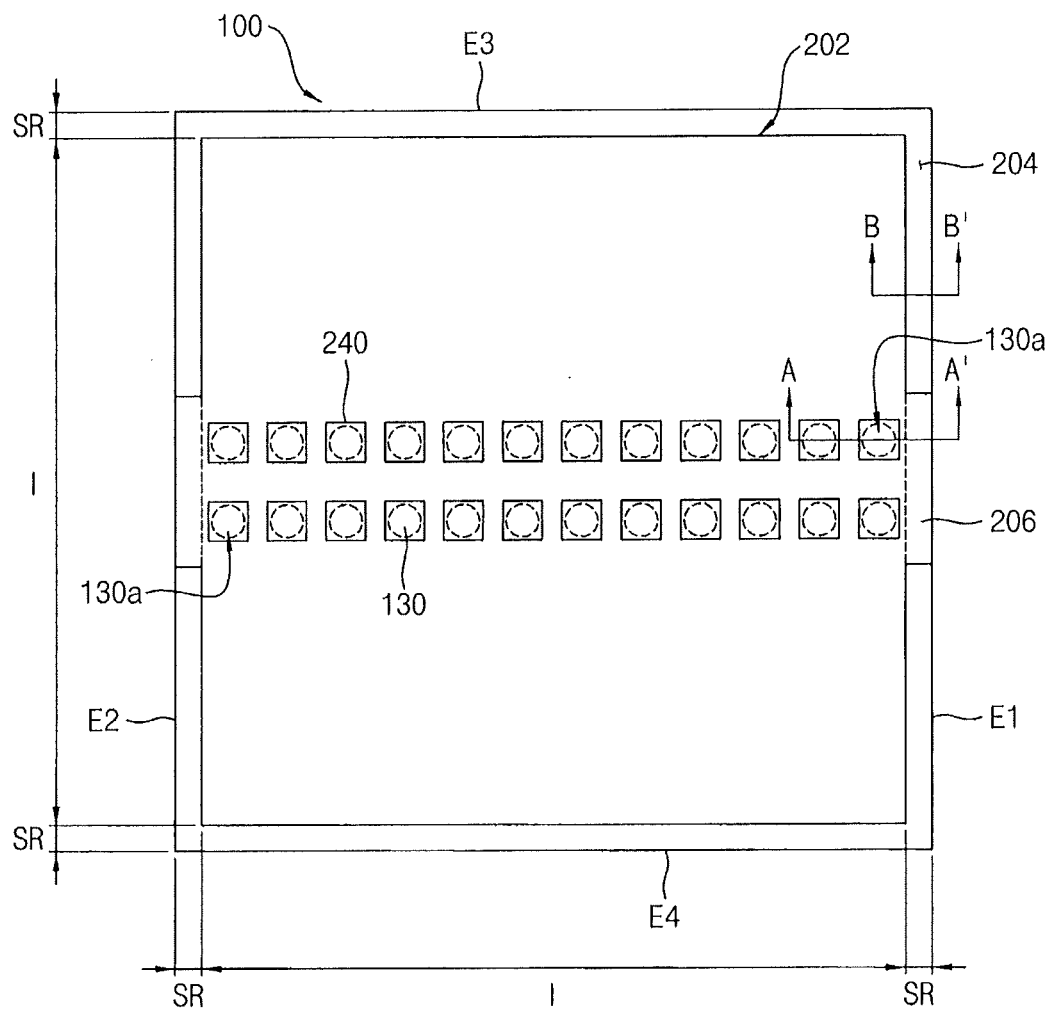
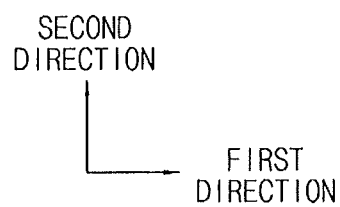

FIG. 16
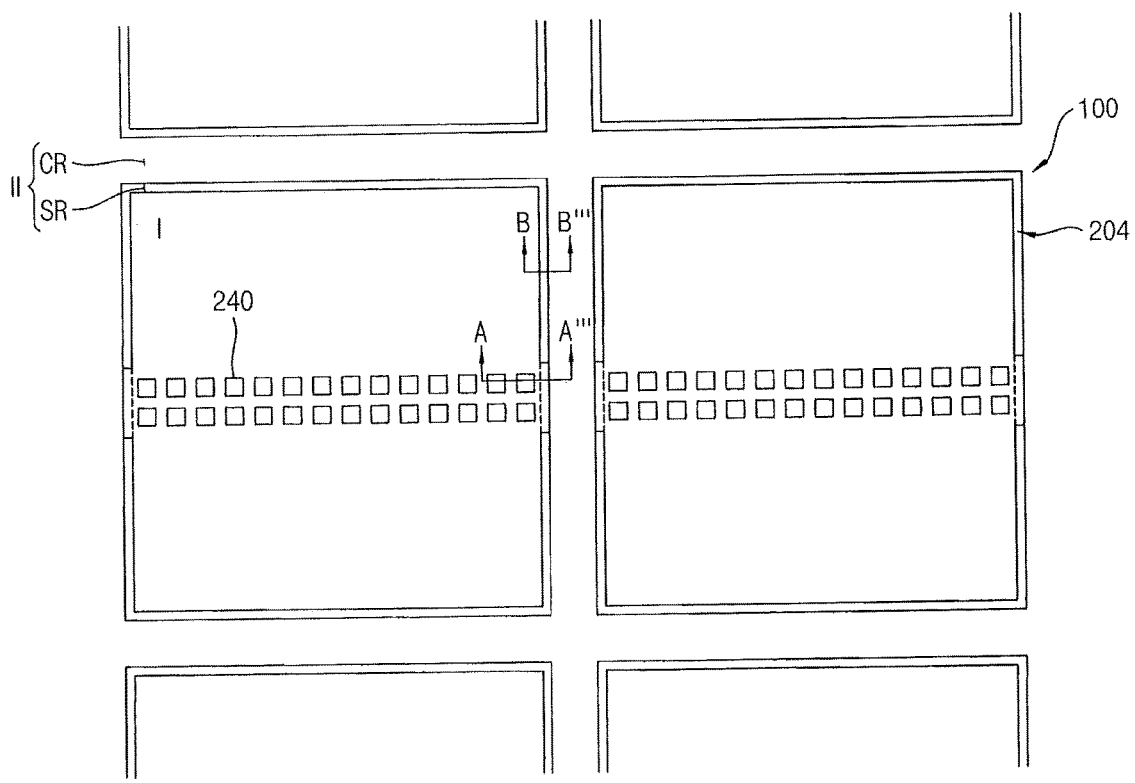
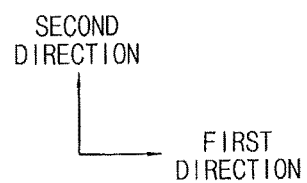

FIG. 25
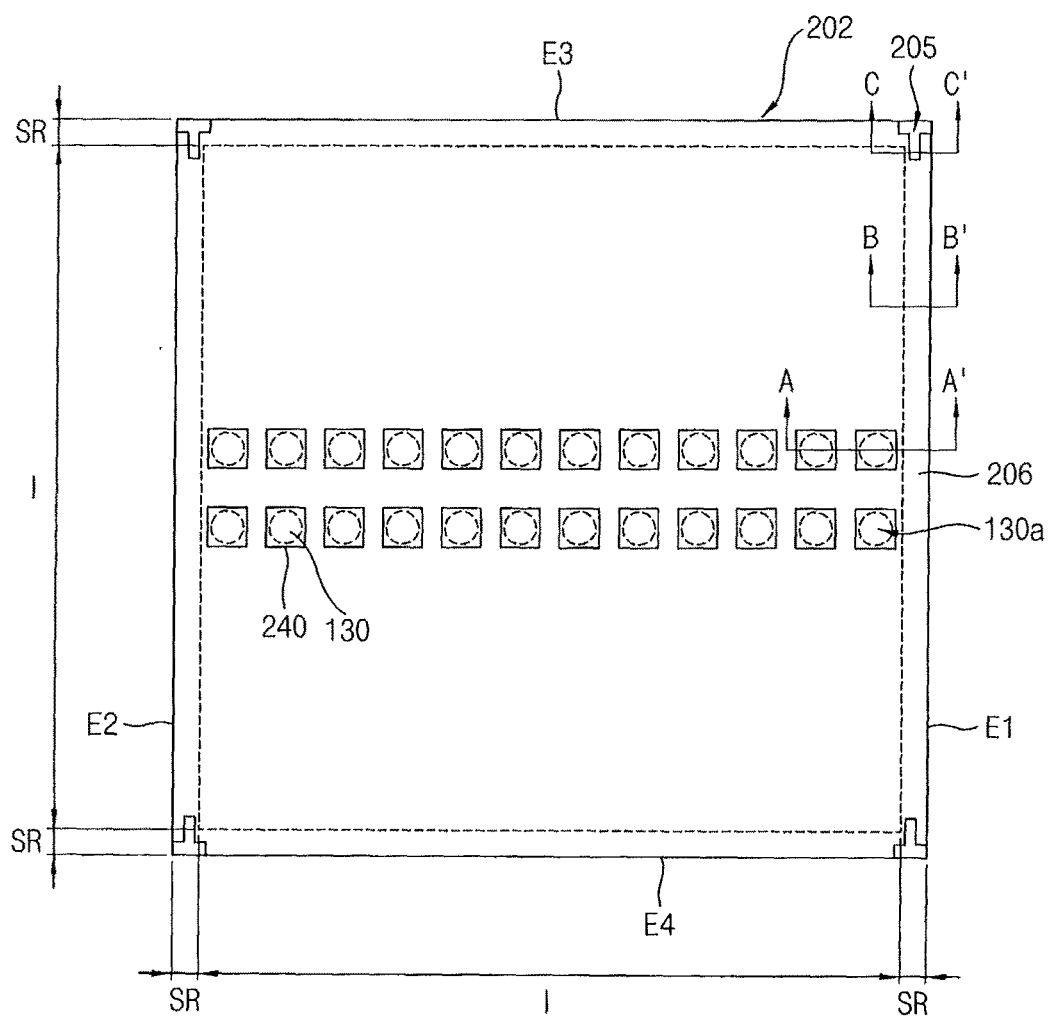
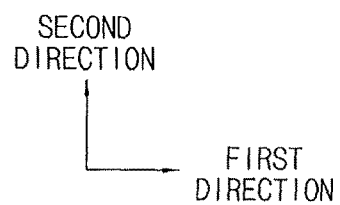

FIG. 29
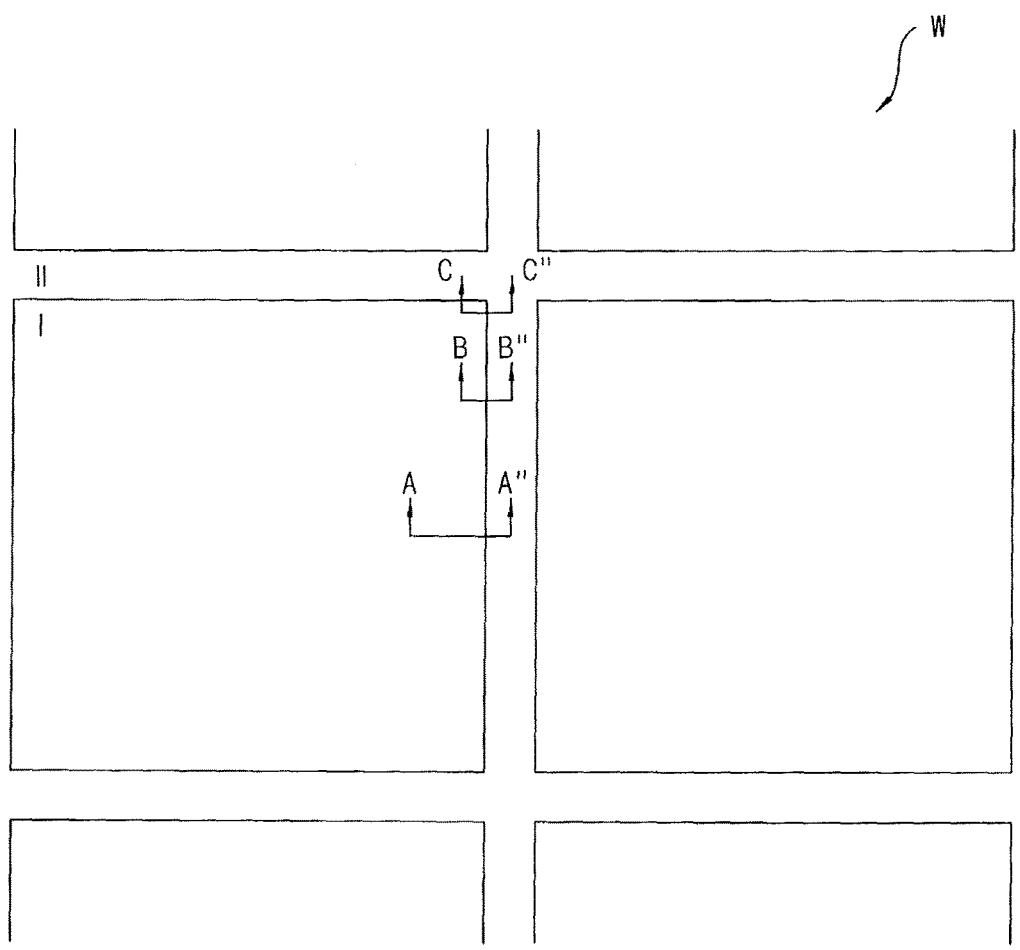
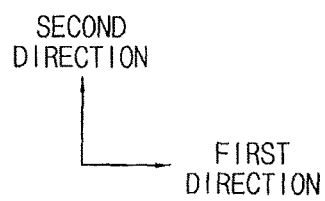

SEMICONDUCTOR DEVICES AND METHODS OF MANUFACTURING THE SAME, AND SEMICONDUCTOR PACKAGES INCLUDING THE SEMICONDUCTOR DEVICES

PRIORITY STATEMENT

This application claims priority under 35 U.S.C. §119 to Korean Patent Application No. 10-2015-0106828, filed on Jul. 28, 2015 in the Korean Intellectual Property Office (KIPO), the contents of which are herein incorporated by reference in their entirety.

BACKGROUND

1. Field

Exemplary embodiments relate to a semiconductor device and a method of manufacturing the same, and a semiconductor package including the semiconductor device. More particularly, exemplary embodiments relate to a semiconductor device having a via structure and a method of manufacturing the same, and a semiconductor package including the semiconductor device.

2. Description of the Related Art

As semiconductor devices have been highly integrated, a three-dimensional packaging technology in which a plurality of chips may be stacked on each other has been developed. A through silicon via (TSV) technology is a packaging technology in which a via hole may be formed through a silicon substrate and a via electrode may be formed in the via hole.

In order to electrically connect a chip having a TSV therein to another chip, a conductive bump may be formed to contact the TSV, and a back side of a silicon substrate in which the TSV is formed may be partially removed and a chemical mechanical polishing (CMP) process may be performed to expose the TSV. However, when the CMP process is performed, the TSV adjacent to a scribe lane region may be bent or may fall down. Thus, a semiconductor device including the TSV and a semiconductor package including the semiconductor device may exhibit poor reliability.

SUMMARY

Exemplary embodiments provide a semiconductor device having a high reliability.

Exemplary embodiments provide a method of manufacturing a semiconductor device having a high reliability.

Exemplary embodiments provide a semiconductor package having a high reliability.

According to exemplary embodiments, a semiconductor device includes a substrate including a die region and a scribe region surrounding the die region, a plurality of via structures penetrating through the substrate in the die region, a portion of the via structure being exposed over a surface of the substrate, and a protection layer pattern structure provided on the surface of the substrate, surrounding a sidewall of the exposed portion of the via structure and having a protruding portion covering at least a portion of the scribe region adjacent to the via structure.

In exemplary embodiments, the protection layer pattern structure may have a scribe lane recess along the scribe region of the substrate.

In exemplary embodiments, the protruding portion may have a width substantially the same as a width of the scribe lane recess.

In exemplary embodiments, the protruding portion may protrude in a first direction from the via structure and the scribe lane recess may extend in a second direction substantially perpendicular to the first direction.

In exemplary embodiments, the protruding portion may protrude in a first direction from the via structure and the protruding portion may be spaced apart from the outermost via structure by a distance equal to or less than ten times a diameter of the via structure.

In exemplary embodiments, the protruding portion may extend in a second direction substantially perpendicular to the first direction by a distance of at least the diameter of the via structure.

In exemplary embodiments, the protection layer pattern structure may have a plurality of the protruding portions and the protruding portions may be spaced apart from each other along the scribe region.

In exemplary embodiments, the protection layer pattern structure may include a nitride layer pattern and an oxide layer pattern sequentially stacked on the surface of the substrate.

In exemplary embodiments, the protection layer pattern structure may include a photosensitive organic insulating material.

In exemplary embodiments, the via structure may include a via electrode.

In exemplary embodiments, the via electrode may include a conductive pattern and a barrier layer pattern surrounding a sidewall of the conductive pattern.

In exemplary embodiments, the via structure may include an insulation layer pattern surrounding a sidewall of the via electrode.

In exemplary embodiments, the semiconductor device may further include a pad structure making contact with a top surface of the exposed portion of the via structure.

In exemplary embodiments, the pad structure may include a seed pattern and a pad sequentially stacked on each other.

In exemplary embodiments, a plurality of the via structures may be arranged in one direction along a middle region or a peripheral region of the substrate.

According to exemplary embodiments, a semiconductor device includes a substrate having a first surface and a second surface opposite to the first surface, a plurality of via structures penetrating through the substrate, a portion of the via structure being exposed over the first surface of the substrate, and a protection layer pattern structure provided on the first surface of the substrate, surrounding a sidewall of the exposed portion of the via structure, and having a scribe lane recess along at least one of edges of the substrate and a protruding portion covering a portion of the edge of substrate adjacent to the via structure.

In exemplary embodiments, the protruding portion may have a width substantially the same as a width of the scribe lane recess.

In exemplary embodiments, the protruding portion may protrude in a first direction from the via structure and the scribe lane recess may extend in a second direction substantially perpendicular to the first direction.

In exemplary embodiments, the protruding portion may protrude in a first direction from the via structure and the protruding portion may be spaced apart from the outermost via structure by a distance equal to or less than ten times a diameter of the via structure.

In exemplary embodiments, the protruding portion may extend in a second direction substantially perpendicular to the first direction by a distance of at least the diameter of the via structure.

According to exemplary embodiments, there is provided a method manufacturing a semiconductor device, comprising. In the method, a substrate including a die region and a scribe lane region surrounding the die region is provided. A plurality of via structures is formed to partially penetrate through the substrate in the die region. The substrate is partially removed to expose a portion of the via structure. A protection layer structure is formed on the substrate to cover the exposed portion of the via structure. The protection layer structure is partially etched the protection layer structure in the scribe lane region to form a protection layer pattern structure covering a portion of the scribe lane region adjacent to the via structure. The protection layer pattern structure is planarized until a top surface of the via structure is exposed.

In exemplary embodiments, when the protection layer structure is formed, a nitride layer may be formed on the substrate, and an oxide layer may be formed on the nitride layer.

In exemplary embodiments, the protection layer structure is partially etched to form the protection layer pattern structure, a photoresist layer may be formed on the protection layer structure, the photoresist layer may be patterned to form a photoresist pattern partially exposing the protection layer structure, and the protection layer structure may be etched using the photoresist pattern as an etching mask.

In exemplary embodiments, when the protection layer structure is formed, a photosensitive organic layer may be formed on the substrate to cover the exposed via structure.

In exemplary embodiments, when the protection layer structure is partially etched to form the protection layer pattern structure, the photosensitive organic layer may be patterned to form an organic layer pattern partially exposing the protection layer structure, the organic layer pattern may be cured, and the protection layer structure may be etched using the organic layer pattern as an etching mask.

In exemplary embodiments, when the protection layer structure is partially etched, the via structure may be partially exposed.

In exemplary embodiments, when the protection layer pattern structure is planarized until a top surface of the via structure is exposed, a chemical mechanical polishing (CMP) process may be performed.

In exemplary embodiments, a pad structure may be further formed on the via structure.

In exemplary embodiments, the substrate may be cut along the scribe lane region.

In exemplary embodiments, when the substrate is cut along the scribe lane region, a cutting region of the scribe lane region may be removed to form individual semiconductor devices such that each of the semiconductor devices has a scribe region surrounding the die region.

In exemplary embodiments, the protection layer pattern structure may have a scribe lane recess along the scribe region and a protruding portion covering a portion of the scribe region adjacent to the outermost via structure.

According to exemplary embodiments, a protection layer pattern structure may be formed to surround a sidewall of a portion of a via structure exposed over the backside of the substrate, and a CMP process may be performed to remove an upper portion of the exposed TSV. The protection layer pattern structure covers a portion of a scribe lane region adjacent to the outermost via structure.

According to exemplary embodiments the protection layer pattern structure may prevent the upper portion of the outermost via structure exposed over the backside of the substrate from deforming, such as by bending or falling down, when the upper portions of the via structures are removed by the CMP process. As a result, the via structure may have excellent physical characteristics. Further, the deposition thickness of the protection layer structure may be reduced to thereby decrease a CMP process time and reduce production cost.

In exemplary embodiments in accordance with principles of inventive concepts a semiconductor device includes a substrate including a die region and a scribe region surrounding the die region; a plurality of via structures penetrating through the substrate in the die region, a portion of the via structure projecting through the substrate to be exposed beyond a surface of the substrate; and a protection layer pattern structure on the surface of the substrate surrounding a sidewall of the exposed portion of the via structure extending into the scribe region adjacent to the via structure substantially the width of the scribe region and extending in a direction perpendicular to that, in the direction of the scribe region, beyond the via structure without filling the entire scribe region.

In exemplary embodiments in accordance with principles of inventive concepts the extended portion of the protection layer pattern begins at the edge of the scribe region spaced apart from the outermost edge of a the outermost via in the via structure by a distance less than or equal to ten times the diameter of the via structure.

In exemplary embodiments in accordance with principles of inventive concepts the via structure comprises a via electrode.

In exemplary embodiments in accordance with principles of inventive concepts the via electrode comprises a conductive pattern and a barrier layer pattern surrounding a sidewall of the conductive pattern.

In exemplary embodiments in accordance with principles of inventive concepts the via structure comprises an insulation layer pattern surrounding a sidewall of the via electrode.

BRIEF DESCRIPTION OF THE DRAWINGS

Exemplary embodiments will be more clearly understood from the following detailed description taken in conjunction with the accompanying drawings. FIGS. 1 to 39 represent non-limiting, exemplary embodiments as described herein.

FIG. 1 is a perspective view illustrating a semiconductor device in accordance with some exemplary embodiments.

FIG. 2 is a partially exploded perspective view illustrating a portion of the semiconductor device in FIG. 1.

FIG. 3 is a plan view illustrating the semiconductor device in FIG. 1.

FIG. 4 is a cross-sectional view taken along the line A-A' in FIG. 3.

FIG. 5 is a cross-sectional view taken along the line B-B' in FIG. 3.

FIG. 6 and FIG. 16 are plan views illustrating a method of manufacturing a semiconductor device in accordance with exemplary embodiments.

FIGS. 7 to 15 and FIG. 17 are cross-sectional views illustrating the method of manufacturing a semiconductor device in accordance with exemplary embodiments.

FIGS. 18 to 22 are cross-sectional views illustrating a method of manufacturing a semiconductor device in accordance with exemplary embodiments.

FIG. 23 is a plan view illustrating a semiconductor device in accordance with exemplary embodiments.

FIG. 24 is a plan view illustrating a semiconductor device in accordance with exemplary embodiments.

FIG. 25 is a plan view illustrating a semiconductor device in accordance with exemplary embodiments.

FIG. 26 is a cross-sectional view taken along the line A-A' in FIG. 25.

FIG. 27 is a cross-sectional view taken along the line B-B' in FIG. 25.

FIG. 28 is a cross-sectional view taken along the line C-C' in FIG. 25.

FIG. 29 and FIG. 34 are plan views illustrating a method of manufacturing a semiconductor device in accordance with exemplary embodiments.

FIGS. 30 to 33 and FIG. 35 are cross-sectional views illustrating the method of manufacturing a semiconductor device in accordance with exemplary embodiments.

FIG. 36 is a cross-sectional view illustrating a semiconductor package in accordance with exemplary embodiments.

FIG. 37 is a view illustrating a memory module including a semiconductor device in accordance with exemplary embodiments.

FIG. 38 is a view illustrating a semiconductor module including a semiconductor device in accordance with exemplary embodiments.

FIG. 39 is a block diagram illustrating an electronic system including a semiconductor device in accordance with exemplary embodiments.

DETAILED DESCRIPTION OF EXEMPLARY EMBODIMENTS

Figure 1:
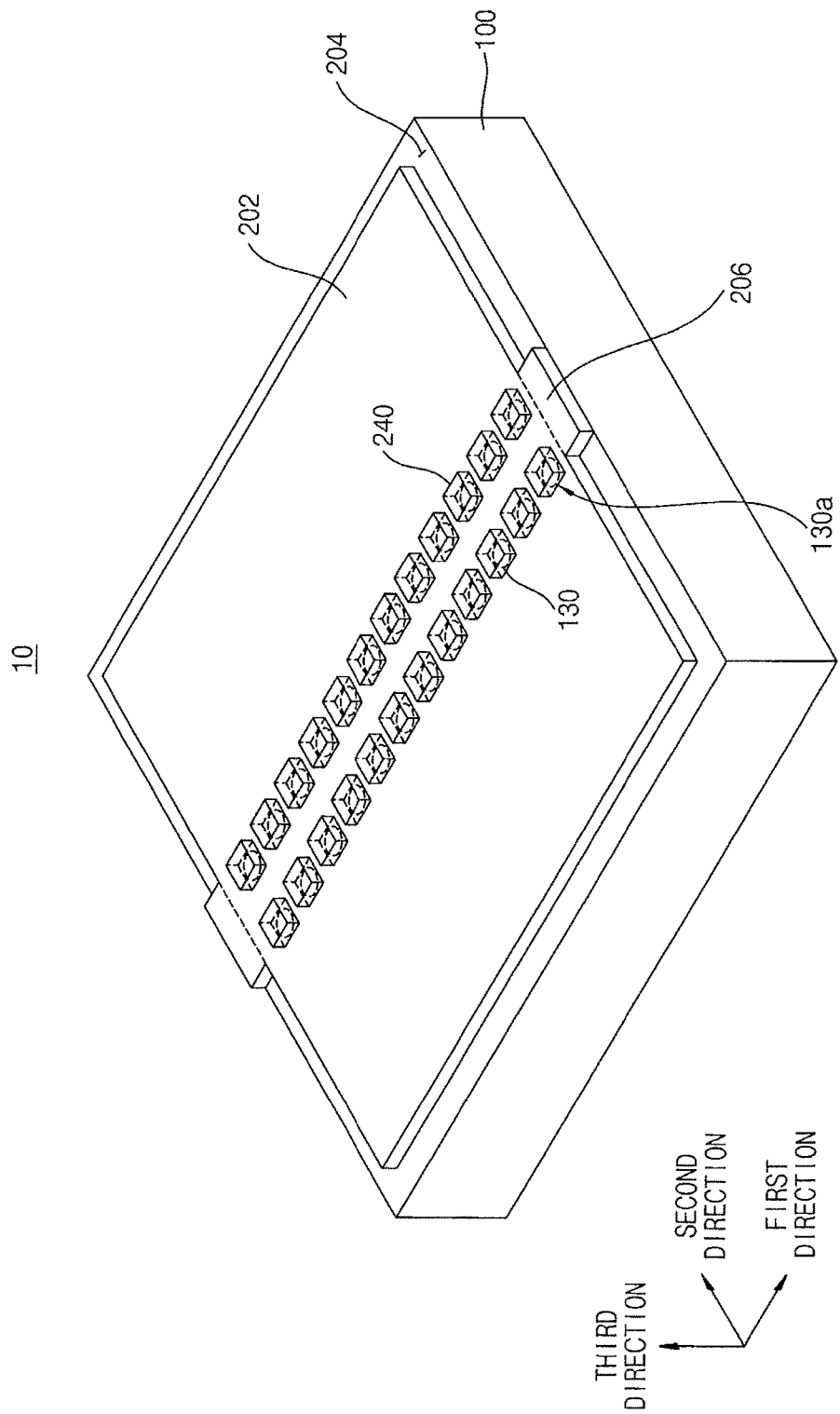

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough and complete, and will fully convey the scope of exemplary embodiments to those skilled in the art. In the drawings, the sizes and relative sizes of components or elements may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element or layer is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be explained in detail with reference to the accompanying drawings.

Figure 2:
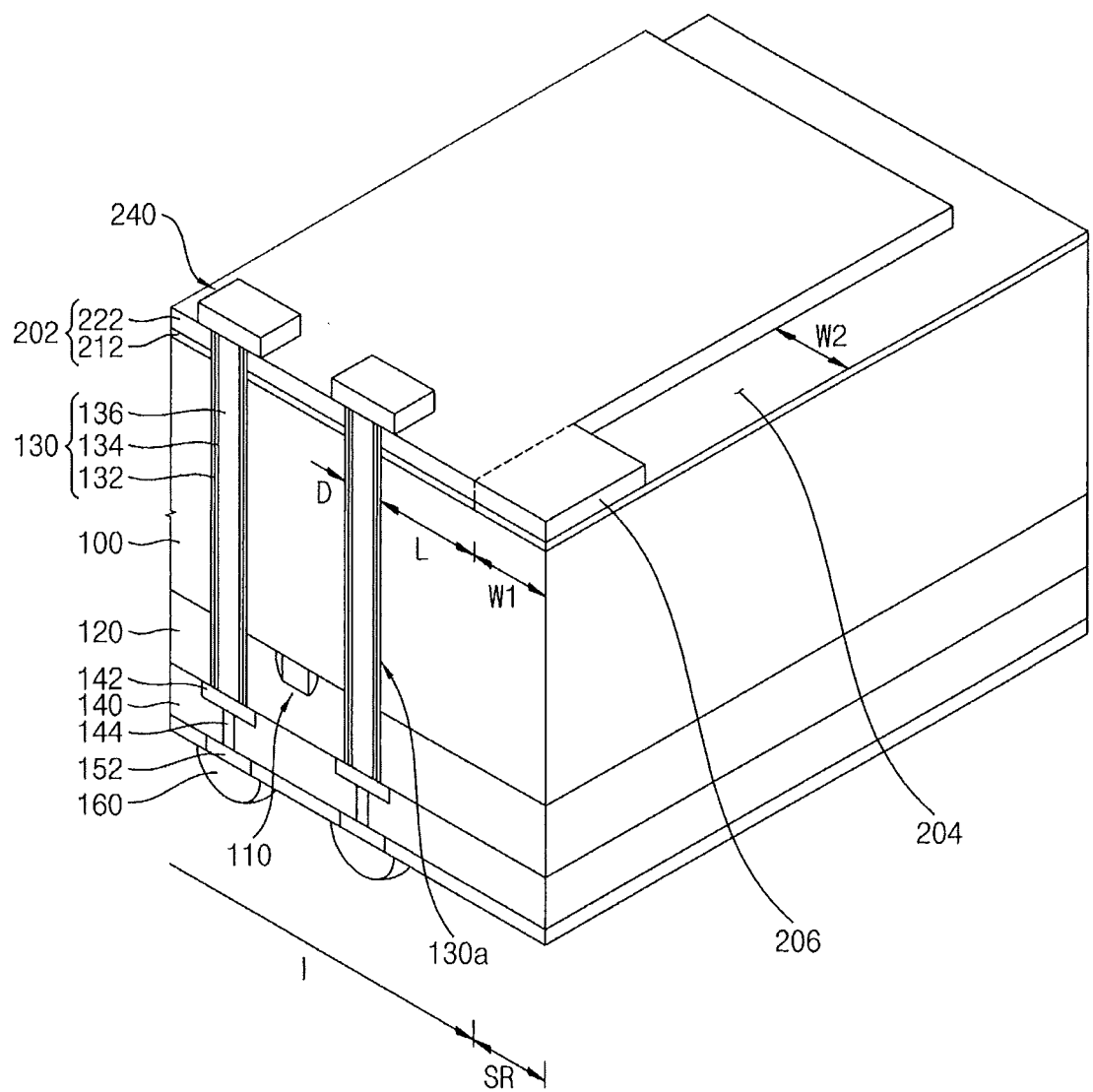
Figure 4:
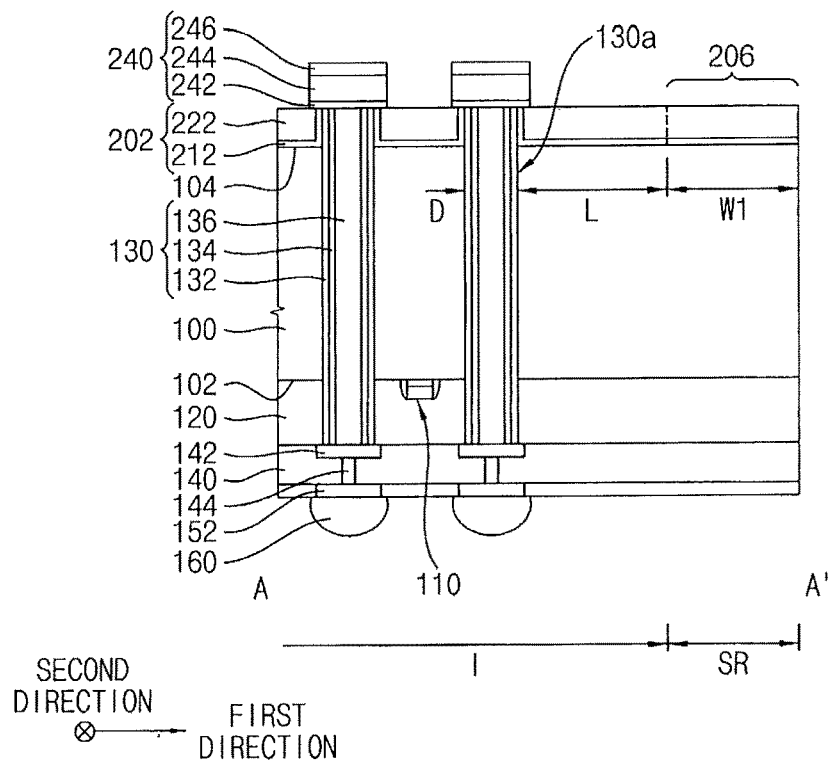
Figure 5:
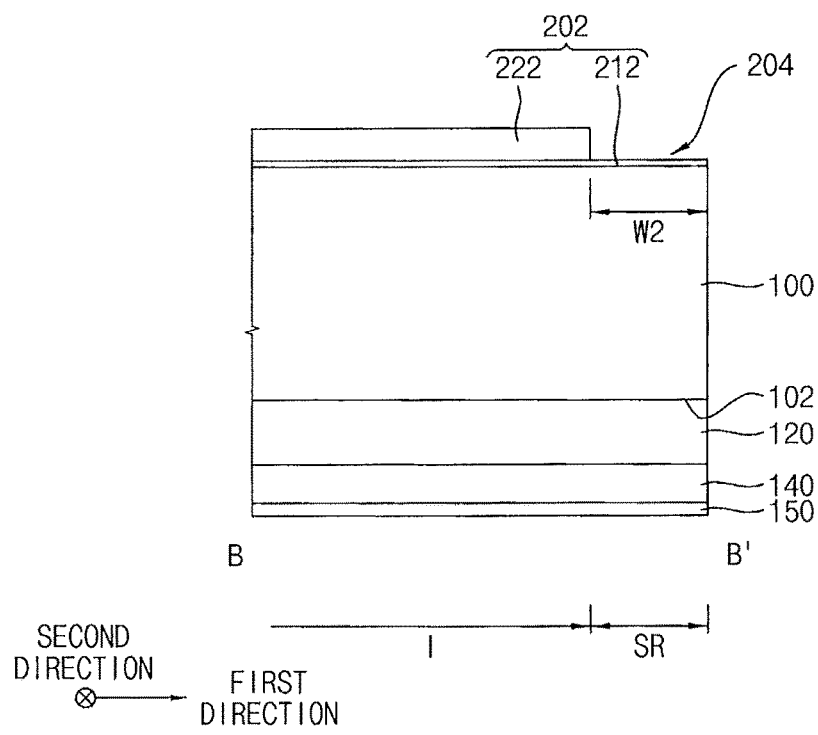

FIG. 1 is a perspective view illustrating an exemplary embodiment of a semiconductor device in accordance with principles of inventive concepts. FIG. 2 is a partially exploded perspective view illustrating a portion of the semiconductor device in FIG. 1. FIG. 3 is a plan view illustrating the semiconductor device in FIG. 1. FIG. 4 is a cross-sectional view taken along the line A-A' in FIG. 3. FIG. 5 is a cross-sectional view taken along the line B-B' in FIG. 3.

Referring to FIGS. 1 to 5, semiconductor device 10 may include a plurality of via structures 130 penetrating through a substrate 100, a protection layer pattern structure 202 and a pad structure 240. The semiconductor device 10 may further include first and second insulating interlayers 120 and 140, circuit elements 110, wirings 142 and 144 and a first conductive bump 160.

The substrate 100 may include silicon, germanium, silicon-germanium, or III-V compounds, for example, GaP, GaAs, GaSb, etc., for example. In some exemplary embodiments, the substrate 100 may be a silicon-on-insulator (SOI) substrate, or a germanium-on-insulator (GOI) substrate.

The substrate 100 may have a first surface 102 and a second surface 104 opposite thereto. The substrate 100 may include a die region I in which cells are formed and a scribe region SR surrounding the die region I. Hereinafter, not only the regions I and SR of the substrate 100 but also spaces extended from the regions I and SR of the substrate 100 upwardly or downwardly may be defined altogether as the regions I and SR, respectively. The circuit elements 110 and via structures 130 may be formed in the die region I of the substrate 100. The substrate 100 may include a first edge E1, a second edge E2 opposite to the first edge E1 and third and fourth edges E3 and E4 adjacent to the first edge E1 and opposite to each other.

A plurality of the die regions I may be divided by a scribe lane region. In exemplary embodiments, the substrate 100 may be cut along the scribe lane region by a sawing process into individual semiconductor chips, and the scribe region SR may be a portion of the scribe lane region which remains after performing the sawing process to remove the portion (a cutting region) of the scribe lane region. Accordingly, the scribe region SR may surround the die region I of the substrate 100 and may be positioned along the first to fourth edges E1, E2, E3 and E4.

Various elements, for example, gate structures, source/drain regions, contact plugs, etc. may be formed on the first surface 102 of the substrate 100 in the die region I. Examples of the circuit elements may include diodes, resistors, inductors, capacitors, etc.

The first insulating interlayer 120 may be formed on the first surface 102 of the substrate 100 to cover the circuit elements, and a contact plug may be formed through the first insulating interlayer 120 to contact an impurity region, such as a source/drain region. The first insulating interlayer 120 may include an oxide, for example, silicon oxide, and the contact plug may include, for example, a metal, a metal nitride, a metal silicide, doped polysilicon, etc., for example.

Via structure 130 may penetrate the first insulating interlayer 120 and the substrate 100, and a portion of via structure 130 may be exposed over the second surface 104 of the substrate 100. A plurality of via structures 130 may be formed in the die region I. For example, via structures 130 may be arranged in one direction along the middle region of the substrate 100.

Two directions substantially parallel to the second surface 104 of the substrate 100 and substantially crossing each other may be referred to as a first direction and a second direction. For example, the first direction and the second direction may be perpendicular to each other. The first edge E1 and the second edge E2 may extend in directions parallel to the second direction and the third edge E3 and the fourth edge E4 may extend in directions parallel to the first direction.

Via structures 130 may be spaced apart from each other in the first direction. Accordingly, the outermost via structure 130a may be arranged closest to the edge E1, E2 of the substrate 100, for example.

In exemplary embodiments, via structure 130 may include a via electrode and an insulation layer pattern 132 surrounding via electrode. The via electrode may include a conductive pattern 136 and a barrier layer pattern 134 surrounding a sidewall of the conductive pattern 136. In exemplary embodiments via structure 130 may have a diameter D of from about 1 µm to about 20 µm. The conductive pattern 136 may include a metal; for example, copper, aluminum, tungsten, etc., or doped polysilicon, and the barrier layer pattern 134 may include a metal nitride; for example, titanium nitride, tantalum nitride, tungsten nitride, copper nitride, aluminum nitride, etc. The insulation layer pattern 132 may include an oxide; for example, silicon oxide, or a nitride, for example, silicon nitride.

In exemplary embodiments, the protection layer pattern structure 202 may be formed on the second surface 104 of the substrate 100 and may surround a sidewall of the portion of via structure 130 exposed over the second surface 104 of the substrate 100. The protection layer pattern structure 202 may have a scribe lane recess 204 along the scribe region SR of the substrate 100 and a protruding portion 206 covering a portion of the scribe region SR adjacent to the outermost via structure 130a. The scribe lane recess 204 may be formed along at least one of the first to forth edges E1, E2, E3 and E4 of substrate 100. The protruding portion 206 may cover the edge portion of the substrate 100 adjacent to the outermost via structure 130a.

For example, the protruding portion 206 may protrude in the first direction from the outermost via structure 130a. The scribe lane recess 204 may extend in the second direction from the protruding portion 206. The protruding portion 206 may be spaced apart from the outermost via structure 130a by a distance equal to or less than ten times a diameter D of via structure 130. That is, the minimum distance L between the outermost via structure 130 and the protruding portion 206 may be equal to or less than ten times the diameter D of via structure 130. A first width W1 of the protruding portion 206 may be substantially the same as a second width W2 of the scribe lane recess 204. Alternatively, the first width W1 of the protruding portion 206 may be less than or greater than the second width W2 of the scribe lane recess 204. The protruding portion 206 may extend in the second direction by a distance of at least the diameter D of via structure 130. That is, the length of the protruding portion 206 in the second direction may be substantially equal to or greater than the diameter D of via structure 130.

In exemplary embodiments, the protection layer pattern structure 202 may include a plurality of protection layer patterns sequentially stacked on the second surface 104 of the substrate 100. For example, the protection layer pattern structure 202 may include a nitride layer pattern 212 and an oxide layer pattern 222 sequentially stacked on the second surface 104 of the substrate 100. The protection layer pattern structure 202 may further include another oxide layer pattern under the nitride layer pattern 212. Alternatively, the protection layer pattern structure 202 may include an oxide layer pattern and a nitride layer pattern sequentially stacked on the second surface 104 of the substrate 100, for example.

In some exemplary embodiments, the protection layer pattern structure 202 may include a photosensitive organic insulating material. In this manner, protection layer pattern structure 202 may include a thermosetting organic polymer and a photosensitive material. The thermosetting organic polymer may include polyimide, novolac, polybenzoxazole, benzocyclobutene, silicon polymer, epoxy polymer, acrylate polymer, etc. The photosensitive material may be a positive photosensitive material. In such exemplary embodiments, the protection layer pattern structure 202 may be a single-layered structure. In other exemplary embodiments, the protection layer pattern structure 202 may be a multi-layered structure. In exemplary embodiments, each layer of the protection layer pattern structure 202 may include the photosensitive organic insulating material, oxide or nitride material, etc.

The pad structure 240 may make contact with a top surface of the exposed portion of via structure 130. The pad structure may include a seed pattern 242 and a pad sequentially stacked. The pad may include a first conductive layer pattern 244 and a second conductive layer pattern 246. The seed pattern 242 may include, for example, copper, and the pad may include, for example, nickel, copper, tungsten, aluminum, tin-silver alloy, etc.

The second insulating interlayer 140 may be formed on the first insulating interlayer 120. The wirings 142 and 144 may penetrate the second insulating interlayer 140 to contact via structure 130. The second insulating interlayer 140 may include a low-k dielectric material, for example, silicon oxide doped with fluorine or carbon, a porous silicon oxide, spin-on organic polymer, or an inorganic polymer, for example, hydrogen silsesquioxane (HSSQ), methyl silsesquioxane (MSSQ), etc.

The first conductive bump 160 may contact a conductive pattern 152 electrically connected to the wiring 144, and may include a metal, for example, silver, copper, etc., or an alloy, for example, such as solder.

As mentioned above, the protection layer pattern structure 202 may have the scribe lane recess 204 along the edge of the substrate in the scribe region SR, which remains after cutting along the scribe lane region by a sawing process and the protruding portion 206 covering the portion of the scribe region SR adjacent to the outermost via structure 130a. Accordingly, in the manufacture of the semiconductor device, while a CMP process is performed on via structures 130 to removed upper portions of via structures 130, an upper portion of the outermost via structure 130a exposed from the second surface 104 of the substrate 100 and closest to the edge of the substrate may be prevented from bending or falling down. Because a process in accordance with principles of inventive concepts prevents the upper portion of the outermost via structure 130a from deforming, such as bending or falling, a semiconductor device having via structure 130 may have excellent physical characteristics, particularly when compared to a device in which such deformations have been allowed to occur.

Figure 6:
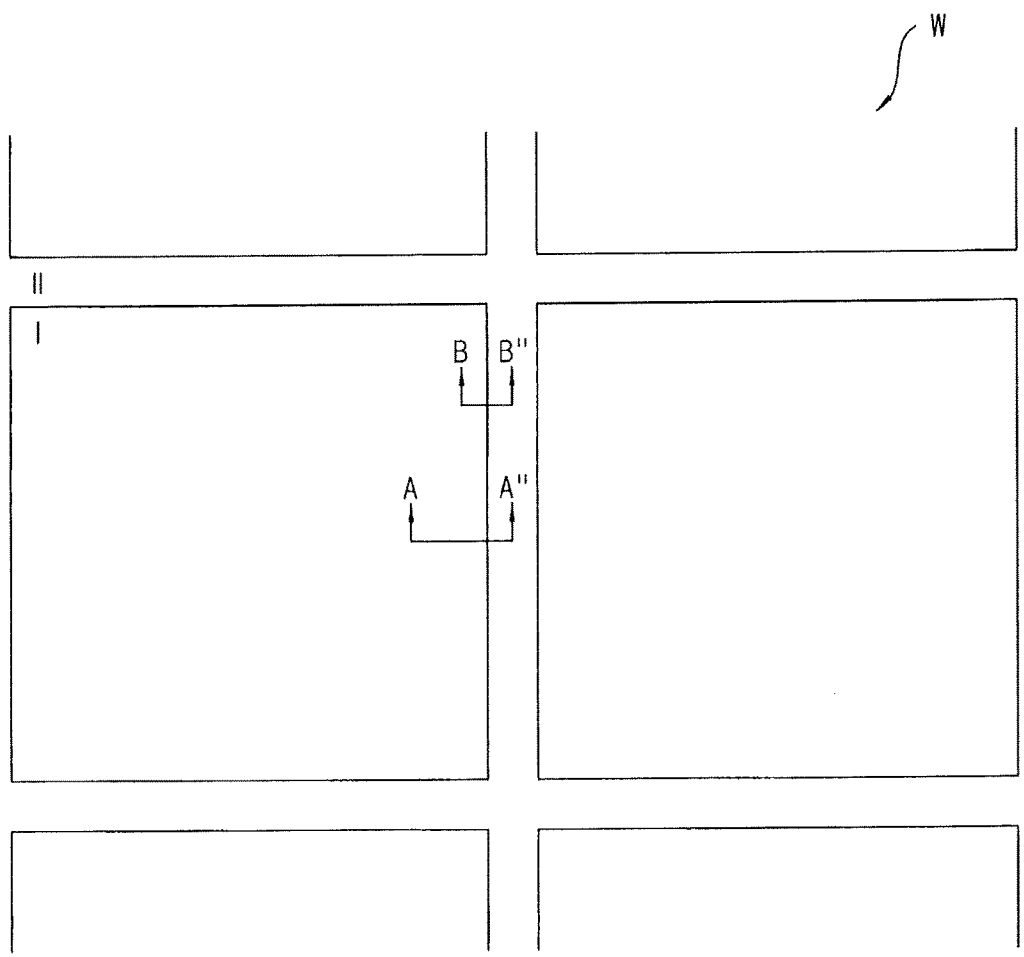
Figure 17:
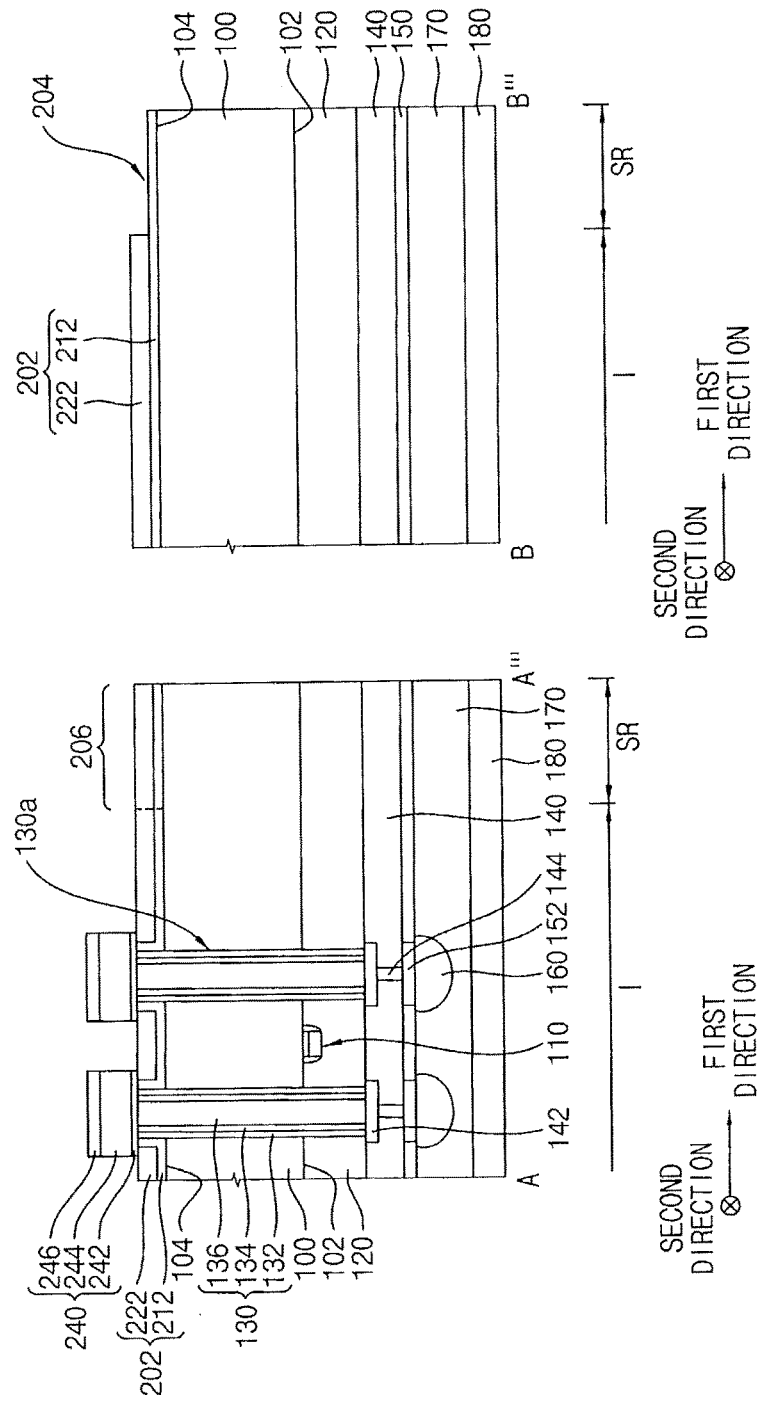

FIG. 6 and FIG. 16 are plan views illustrating a method of manufacturing a semiconductor device in accordance with exemplary embodiments. FIGS. 7 to 15 and FIG. 17 are cross-sectional views illustrating the method of manufacturing a semiconductor device in accordance with exemplary embodiments. FIGS. 7 to 15 include cross-sections cut along lines A-A" and B-B" in FIG. 6. FIG. 17 includes cross-sections cut along lines A-A'" and B-B'" in FIG. 16.

Figure 7:
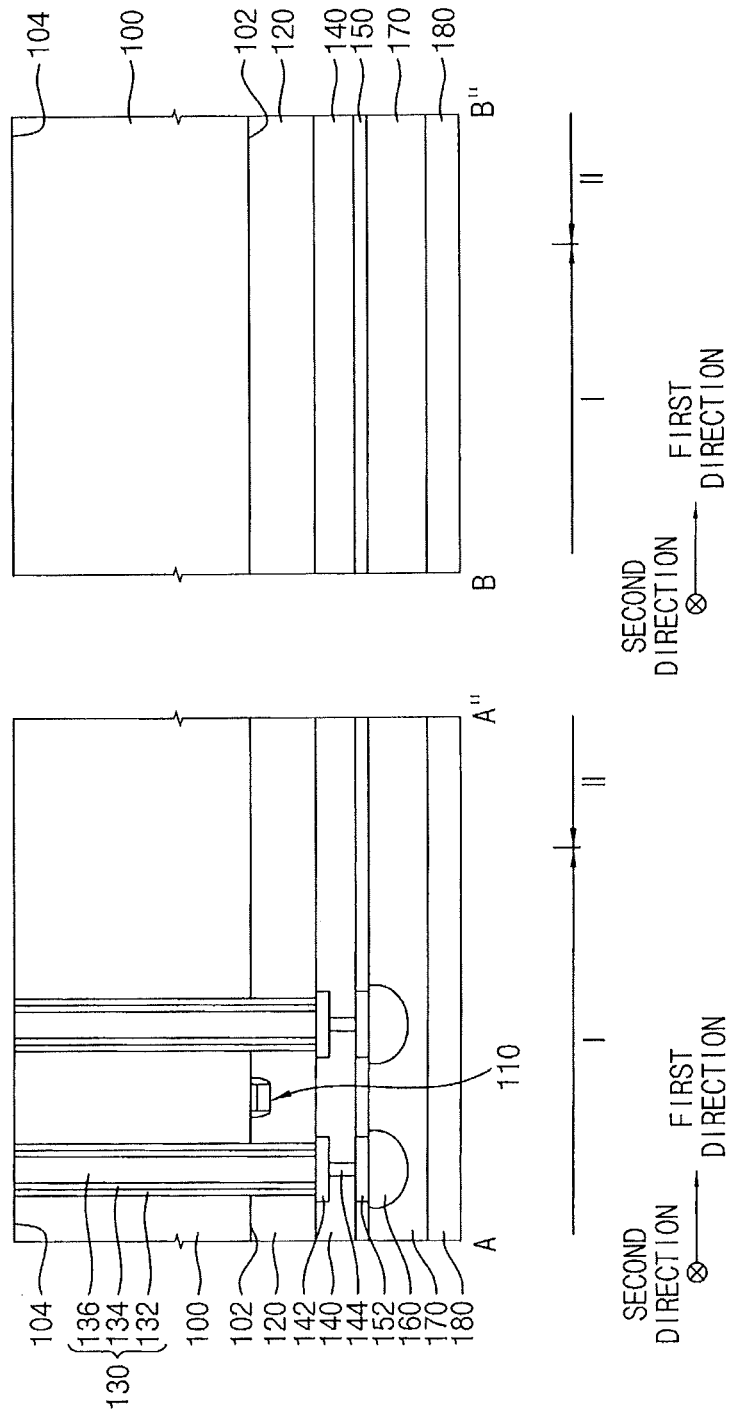

Referring to FIGS. 6 and 7, a substrate 100 such as wafer W having a die region I and a scribe lane region II surrounding the die region I may be prepared, and via structures partially penetrating the substrate 100 may be formed in the die region I.

The substrate may include silicon, germanium, silicon-germanium, or III-V compounds, for example, GaP, GaAs, GaSb, etc. In some embodiments, the substrate 100 may be a silicon-on-insulator (SOI) substrate, or a germanium-on-insulator (GOI) substrate.

The substrate 100 may have a first surface 102 and a second surface 104 opposite to the first surface 102. The substrate 100 may include the die region I in which cells are formed and the scribe lane region II surrounding the die region I. A plurality of the die regions I may be divided by the scribe lane region II. In exemplary embodiments, circuit elements 110 and via structures 130 may be formed in the die region I of the substrate 100. The substrate 100 may be cut along the scribe lane region II by a sawing process, for example, into individual semiconductor chips.

In exemplary embodiments, die region I may include a cell region (not illustrated) in which memory cells are formed and a periphery circuit region (not illustrated) in which peripheral circuits for driving the memory cells are formed. Alternatively, the die region I may further include a logic region in which logic devices are formed.

A transistor serving as the circuit element may be formed by a following method.

After sequentially forming a gate insulation layer and a gate electrode layer on the first surface 101 of the substrate 100 having an isolation layer (not illustrated) thereon, the gate electrode layer and the gate insulation layer may be patterned by a photolithography process to form a gate structure including a gate insulation layer pattern and a gate electrode sequentially stacked on the first surface 101 of the substrate 100 in the die region I. The gate insulation layer may be formed to include an oxide, for example, silicon oxide or a metal oxide, and the gate electrode layer may be formed to include, for example, doped polysilicon, a metal, a metal nitride and/or a metal silicide.

Then, a gate spacer layer may be formed on the substrate 100 and the isolation layer to cover the gate structure, and may be anisotropically etched to form a gate spacer on a sidewall of the gate structure. The gate spacer layer may be formed to include a nitride such as, for example, silicon nitride.

Impurities may be implanted into an upper portion of the substrate 100 adjacent to the gate structure to form an impurity region, so that the transistor including the gate structure and the impurity region may be formed.

In exemplary embodiments, a plurality of transistors may be formed on the substrate 100 in the die region I. The circuit elements may not be limited to the transistor, but various types of circuit elements, for example, diodes, resistors, inductors, capacitors, etc. may be formed.

Then, a first insulating interlayer 120 may be formed on the substrate 100 to cover the circuit elements, and a contact plug may be formed through the first insulating interlayer 120 to contact the impurity region.

The first insulating interlayer 120 may be formed to include an oxide such as, for example, silicon oxide. The contact plug may be formed by forming a contact hole (not illustrated) through the first insulating interlayer 120 to expose the impurity region, forming a conductive layer on the exposed impurity region and the first insulating interlayer 120 to fill the contact hole, and planarizing an upper portion of the conductive layer until a top surface of the first insulating interlayer 120 may be exposed. The conductive layer may be formed to include, for example, a metal, a metal nitride, a metal silicide, doped polysilicon, etc.

Although it is not illustrated in the figures, an additional insulating interlayer may be formed on the first insulating interlayer 130 and a wiring may be formed through the additional insulating interlayer to be electrically connected to the contact plug.

Then, via structure 130 may be formed to partially penetrate substrate 100.

Particularly, the first insulating interlayer 12 and the substrate 100 may be etched to form a first trench (not illustrated). The first trench may be formed through the first insulating interlayer 120 and a portion of the substrate 100. An insulation layer and a barrier layer may be sequentially formed on an inner wall of the first trench, and a conductive layer may be formed on the barrier layer to sufficiently fill the first trench. The insulation layer may be formed to include an oxide, for example, silicon oxide or a nitride such as, for example, silicon nitride, and the barrier layer may be formed to include a metal nitride such as, for example, titanium nitride, tantalum nitride, tungsten nitride, copper nitride, aluminum nitride, etc. The conductive layer may be formed to include a metal such as, for example, copper, aluminum, tungsten, etc., or doped polysilicon.

Then, the conductive layer, the barrier layer and the insulation layer may be planarized until a top surface of the first insulating interlayer 120 may be exposed to form via structure 130 filling the first trench. Via structure 130 may include an insulation layer pattern 132, a barrier layer pattern 134 and a conductive layer pattern 136.

Then, a second insulating interlayer 140 may be formed on the first insulating interlayer 120, and wirings 142 and 144 may be formed through the second insulating interlayer 140.

The second insulating interlayer 140 may be formed to include a low-k dielectric material such as, for example, silicon oxide doped with fluorine or carbon, a porous silicon oxide, spin on organic polymer, or an inorganic polymer, for example, hydrogen silsesquioxane (HSSQ), methyl silsesquioxane (MSSQ), etc.

A protective layer 150 may be formed on the second insulating interlayer 140, and a conductive pattern 152 may be formed to be electrically connected to the wiring 144 and exposed from the protective layer 150. A first conductive bump 160 may be formed on the protective layer 150 to contact a top surface of the conductive pattern 152, an adhesion layer 170 may be formed on the protective layer 150 to cover the first conductive bump 160, and may adhere to a handling substrate 180.

The first conductive bump 160 may be formed to include a metal such as, for example, silver, copper, etc., or an alloy, for example, solder. The handling substrate 180 may be, for example, a glass substrate. The substrate 100 may be overturned using the handling substrate 180 so that the second surface 104 of the substrate 100 may face upward.

Figure 8:
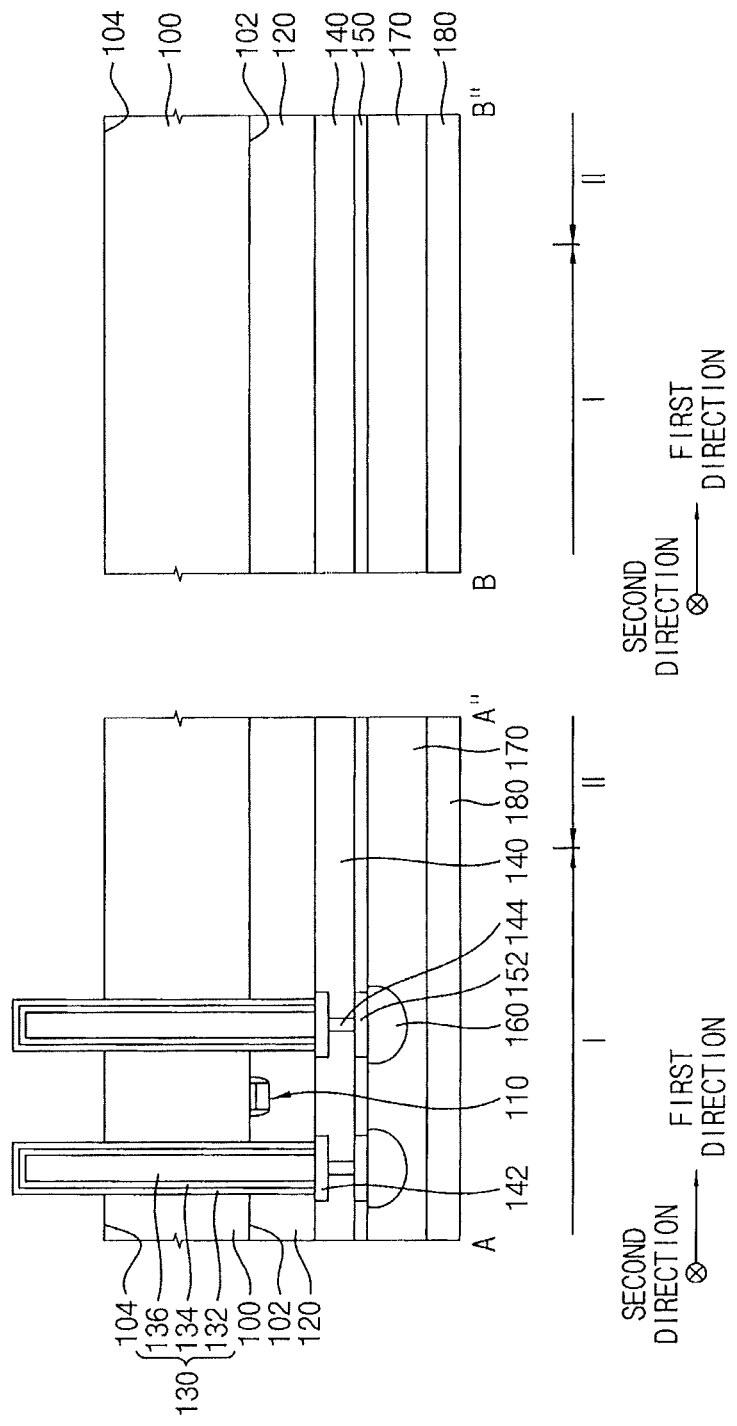

Referring to FIG. 8, a portion of the substrate 100 adjacent to the second surface 104 may be removed to expose a portion of via structure 130. In this manner, in accordance with principles of inventive concepts, the substrate 100 may be partially removed by, for example, an etch back process.

Figure 9:
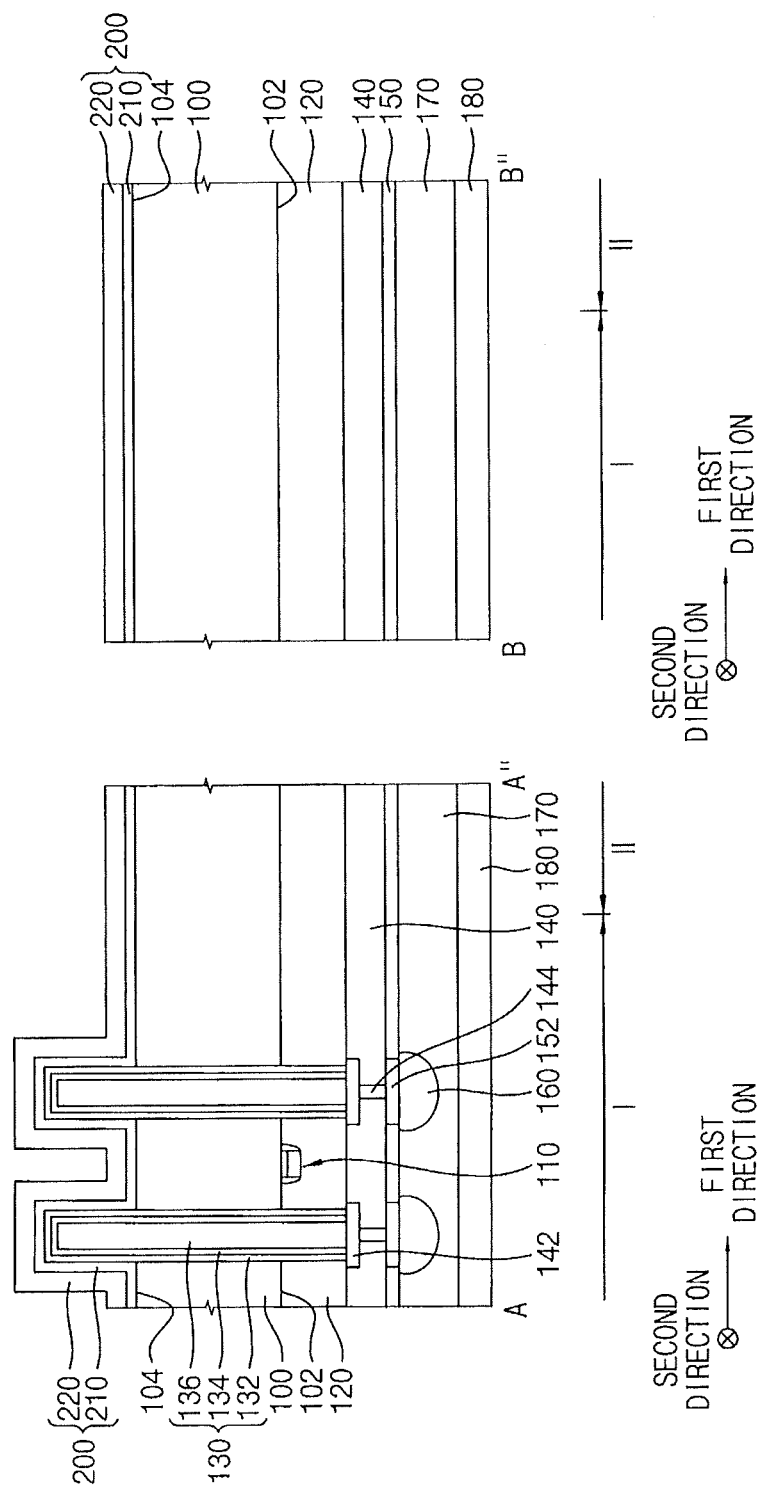

Referring to FIG. 9, a protection layer structure 200 may be formed on the second surface 104 of the substrate 100 and the exposed portion of via structure 130.

In exemplary embodiments, a plurality of protection layers may be sequentially formed on the second surface 104 of the substrate 100 and the exposed via structures 130. In particular, the protection layer structure 200 may be formed to include a nitride layer 210 and an oxide layer 220 sequentially stacked. Additionally, the protection layer structure 200 may further include an oxide layer underneath the nitride layer 210. For example, the oxide layer 220 may be formed to have a thickness more than that of the nitride layer 210. Alternatively, the protection layer structure 200 may be formed to include an oxide layer and a nitride layer sequentially stacked.

Figure 10:
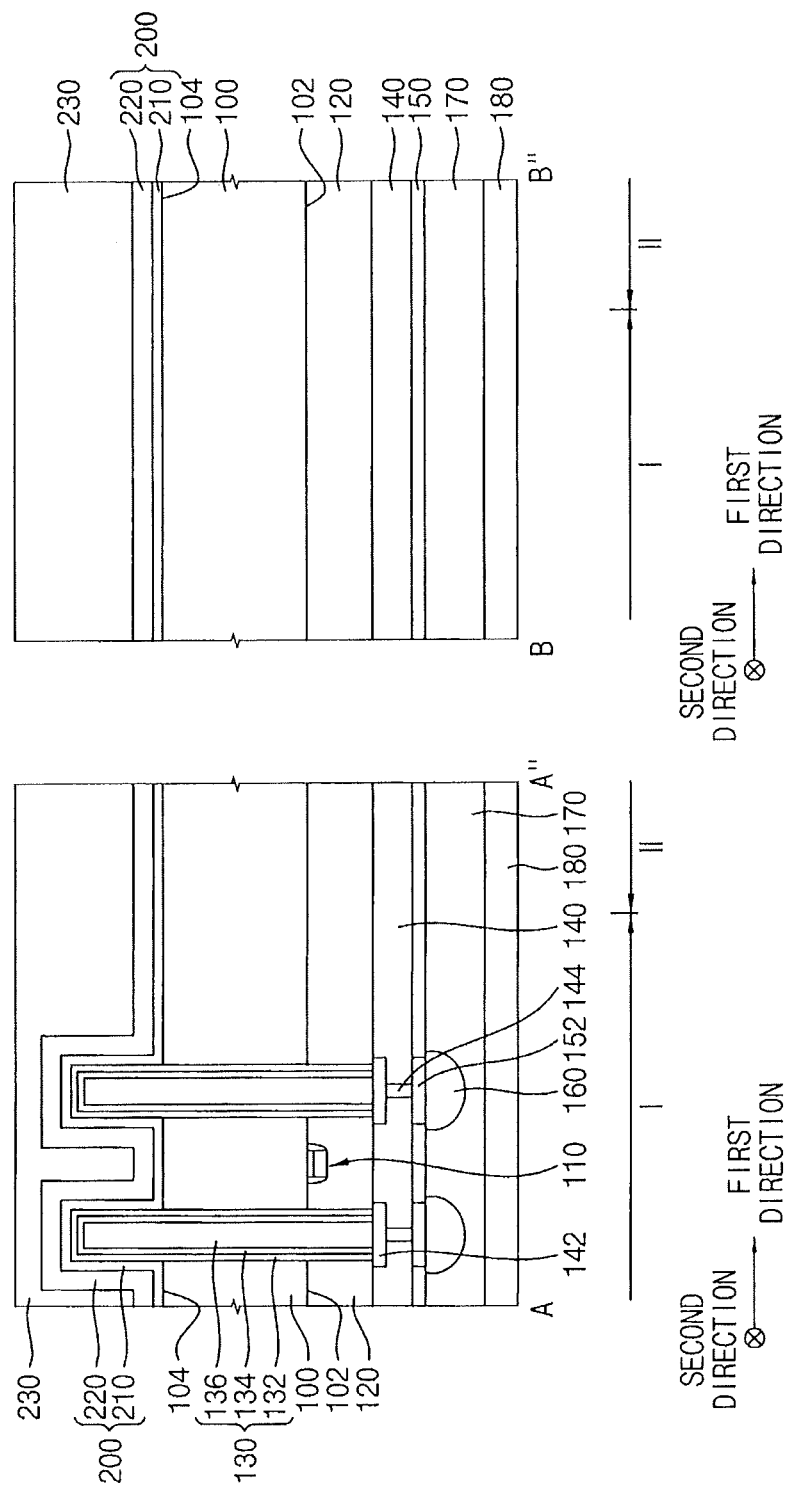

Referring to FIG. 10, a photoresist layer 230 may be formed on the protection layer structure 200.

In exemplary embodiments, the photoresist layer 230 may be formed to have a top surface higher than that of a portion of the protection layer structure 130 on the exposed portion of via structure 130 above the second surface 104 of the substrate 100.

Figure 11:
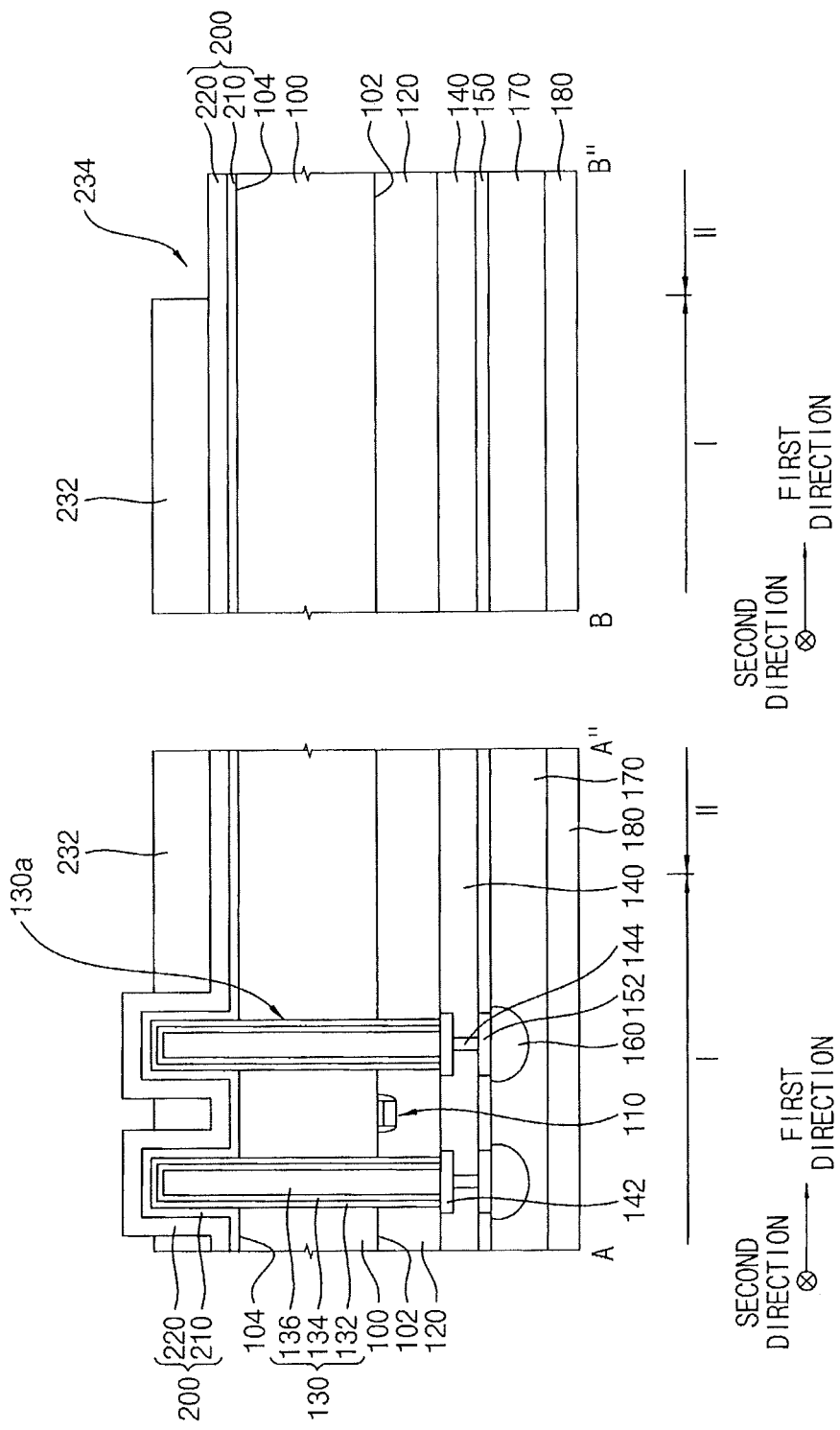

Referring to FIG. 11, the photoresist layer 230 may be patterned by an exposure process and a development process to form a photoresist pattern 232 on the protection layer structure 200.

In exemplary embodiments, the photoresist pattern 232 may be formed to have a first opening 234 for forming a scribe lane and a second opening (not illustrated) for forming an alignment key. The photoresist pattern 232 may cover a portion of the scribe lane region II adjacent to via structure 130a which is arranged outermost in the die region I. Accordingly, in exemplary embodiments the first opening 234 may expose the portion of the scribe lane region II except the portion adjacent to the outermost arranged via structure 130. When the photoresist layer 230 is etched to form the photoresist pattern 232, the portion of the protection layer structure 200 on via structure 130 may be exposed.

Figure 12:
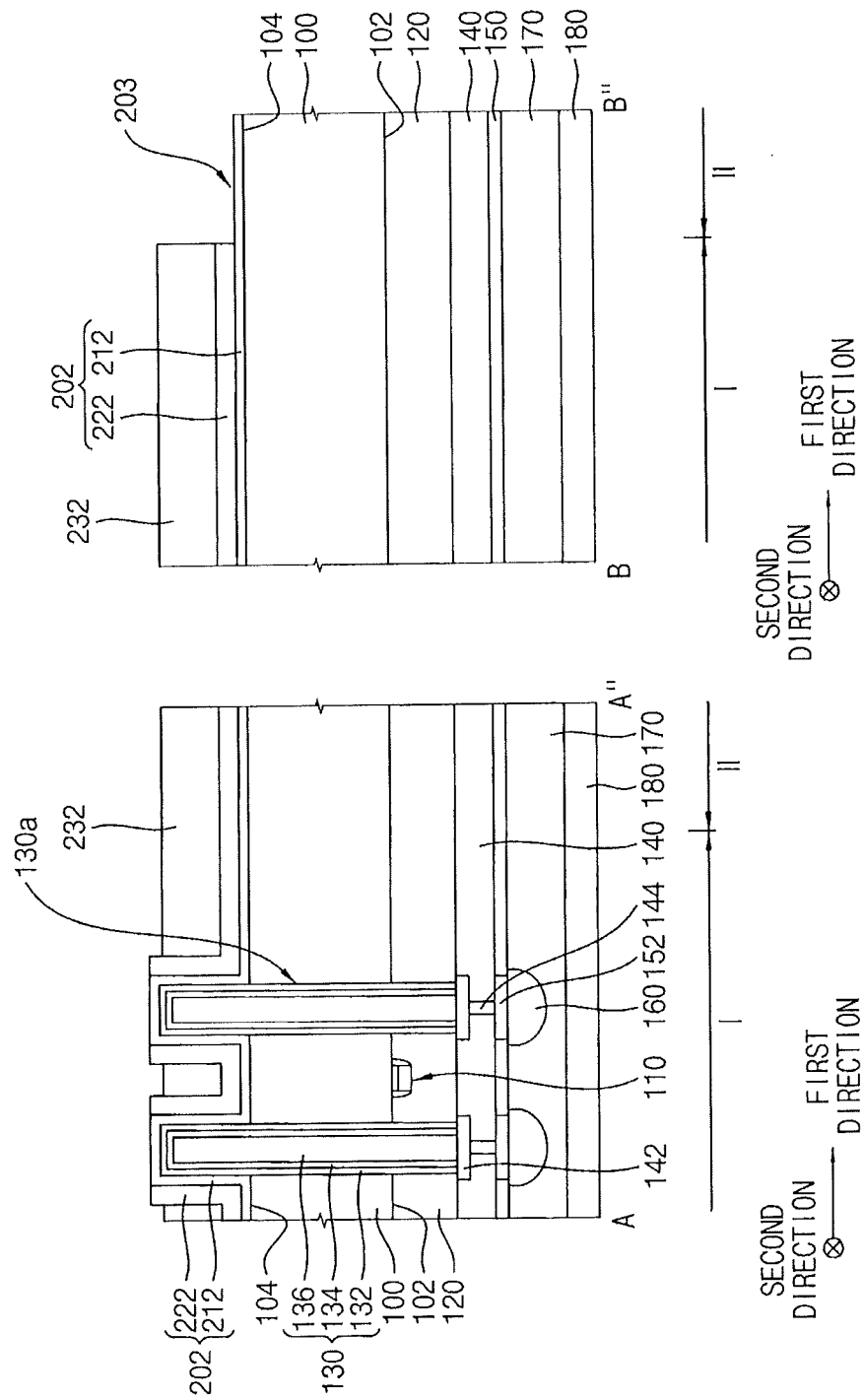

Referring to FIG. 12, the protection layer structure 200 may be etched using the photoresist pattern 232 as an etching mask to form a protection layer pattern structure 202.

In exemplary embodiments, by the etching process, a portion of the protection layer structure 200 exposed by the first opening 234 may be etched to form a trench 203 for forming a scribe lane and a portion of the protection layer structure 200 exposed by the second opening may be etched to form a trench (not illustrated) for forming an alignment key. The trench 203 for forming a scribe lane may be formed in the scribe lane region II except the portion adjacent to the outermost arranged via structure 130a. Additionally, by the etching process, the exposed portion of the protection layer structure 200 on via structure 130 may be etched to expose a portion of via structure 130, and the exposed portion of via structure 130 may be also partially etched.

For example, by the etching process, the portion of the protection layer structure 200 exposed by the first opening 234 may not be completely removed, and, as a result, the second surface 104 of the substrate 100 may not be exposed. That is, portions of an oxide layer pattern 222 under the first opening 234 may be removed, however, a portion of a nitride layer pattern 212 under the first opening 234 may remain. Accordingly, the trench 203 for forming a scribe lane may be formed in the oxide layer pattern 222 of the protection layer pattern structure 202. Alternatively, in exemplary embodiments the portion of the protection layer structure 200 exposed by the first opening 234 may be completely removed. Accordingly, in accordance with principles of inventive concepts the trench for forming a scribe lane may be formed in the oxide layer pattern 222 and the nitride layer pattern 212 of the protection layer pattern structure 202.

As a result, the protection layer pattern structure 202 may surround a sidewall of the portion of via structure 130 exposed from the second surface 104 of the substrate 100. Additionally, the protection layer pattern structure 202 may have the trench 203 for forming a scribe lane which is formed in the scribe lane region II except the portion adjacent to the outermost arranged via structure 130a.

Figure 13:
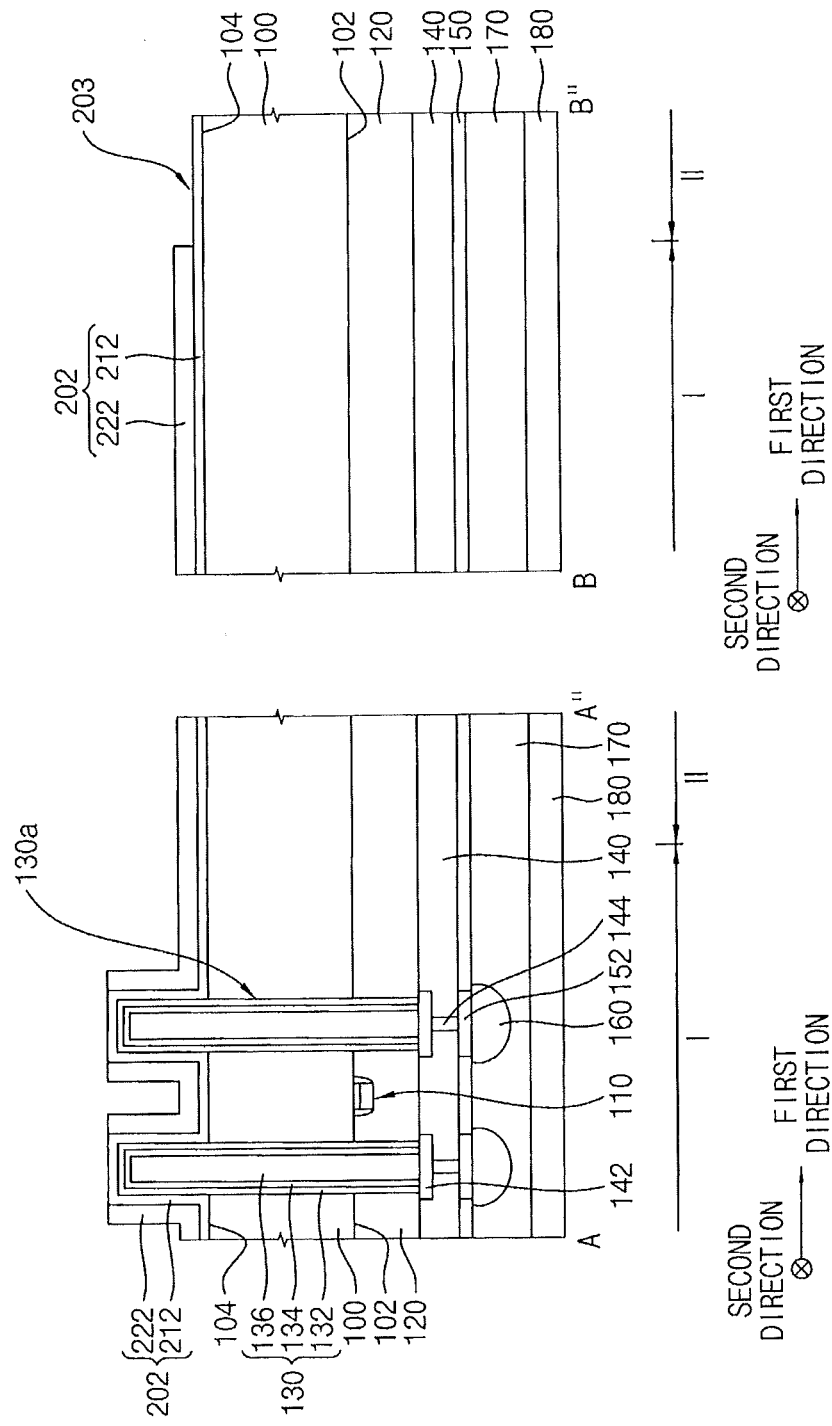
Figure 14:
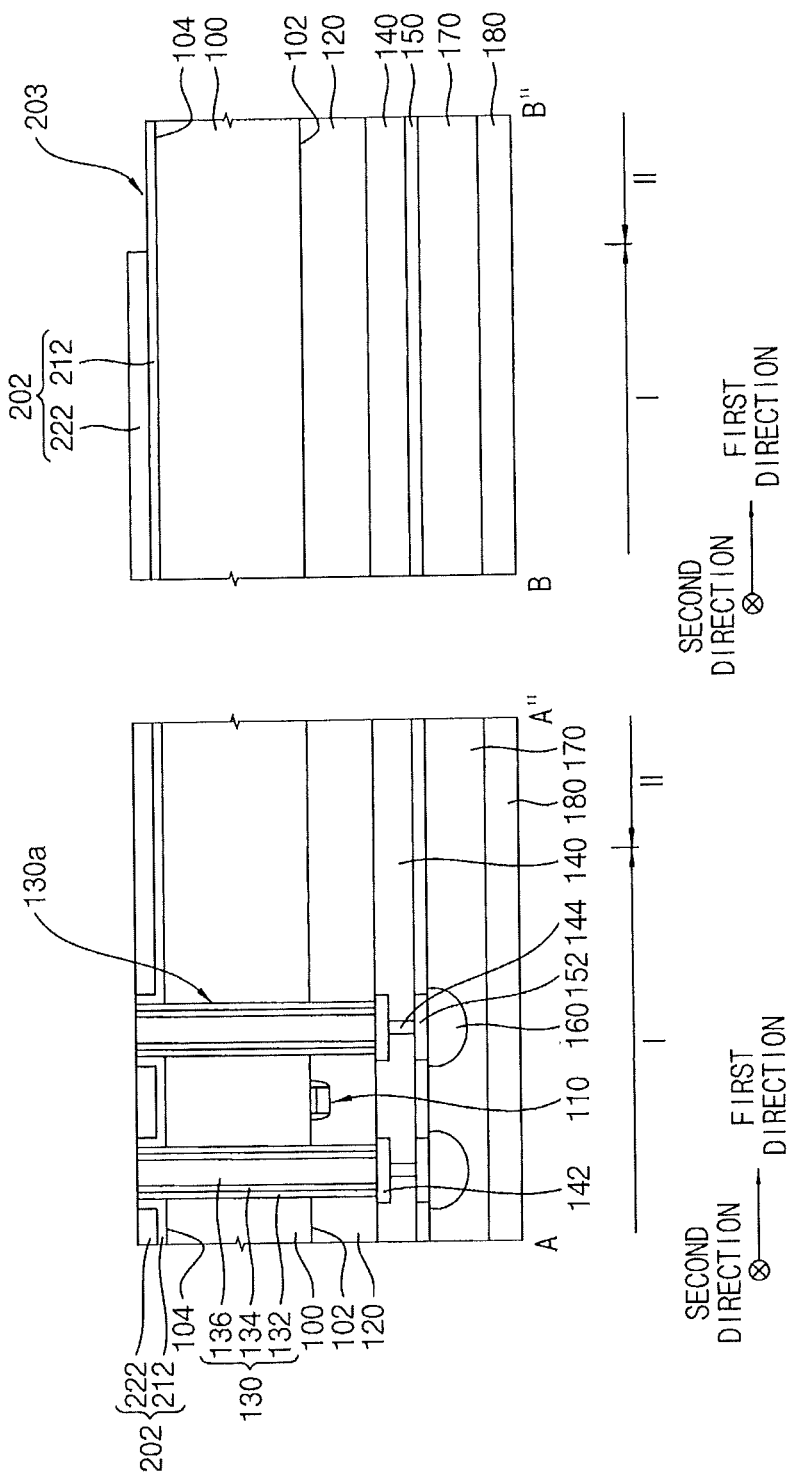

Referring to FIGS. 13 and 14, after removing the photoresist pattern 232, the protection layer pattern structure 202 may be planarized until a top surface of the conductive layer pattern 136 of via structure 130 may be exposed.

The planarization process may be performed by, for example, a chemical mechanical polishing (CMP) process. In exemplary embodiments, an upper portion of the trench 203 for forming a scribe lane and an upper portion of the trench for forming an alignment key may be removed together.

The protection layer pattern structure 202 may cover the portion of the scribe lane region II adjacent to the outermost via structure 130a, and as a result, a step difference between the outermost via structure 130a and the trench for forming a scribe lane may be removed. Accordingly, in accordance with principles of inventive concepts the protection layer pattern structure 202 may prevent the upper portion of the outermost via structure 130a exposed from the second surface 104 of the substrate 100 from bending or falling down when the upper portions of via structures are removed by the CMP process. Because, in a process in accordance with principles of inventive concepts, via structure 130 does not bend or fall down by the CMP process, via structure 130 may have excellent physical characteristics. Additionally, the deposition thickness of the protection layer may be reduced to thereby decrease a CMP process time and reduce production cost.

Figure 15:
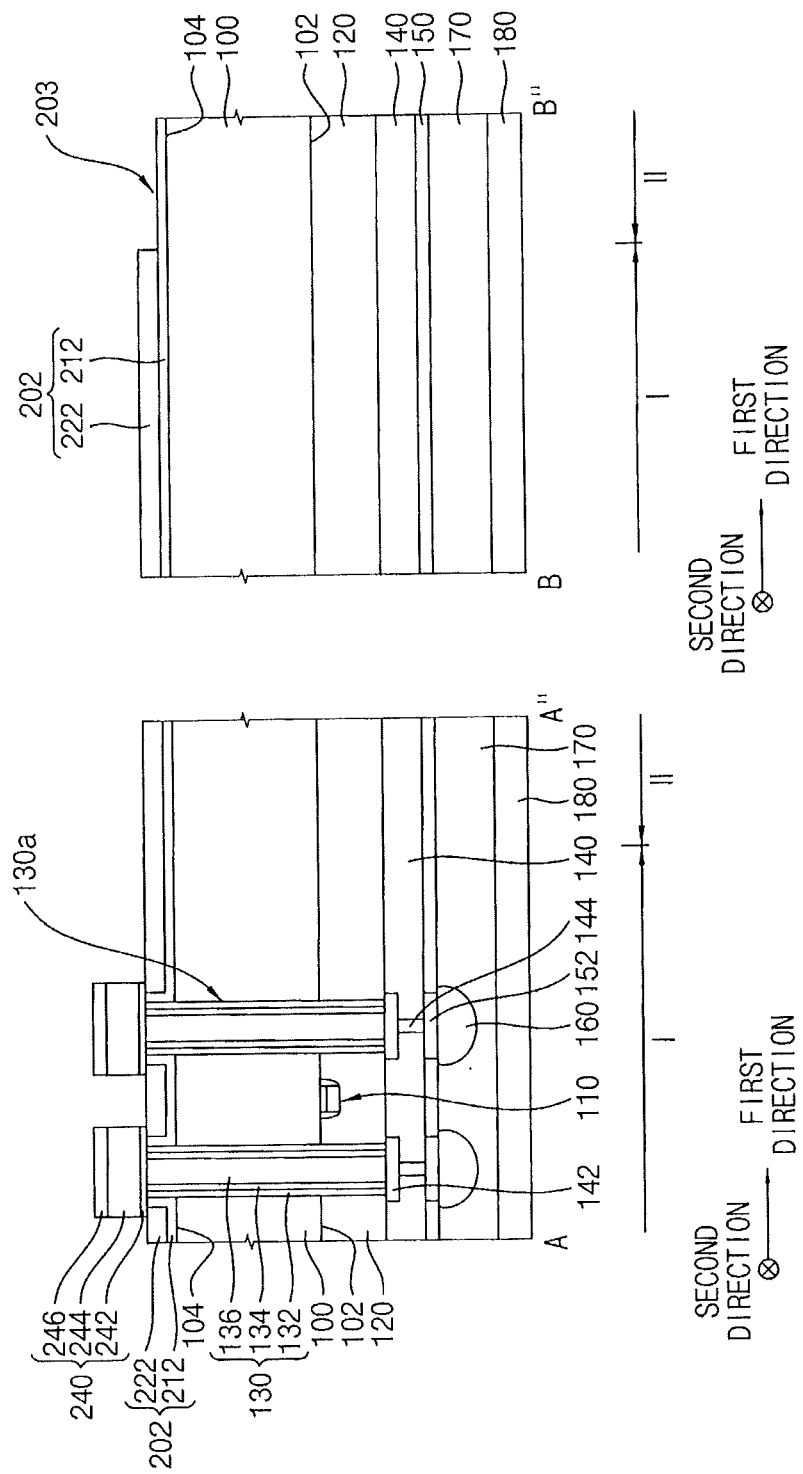

Referring to FIG. 15, a pad structure 240 may be formed on via structure 130.

A seed layer may be conformally formed on top surfaces of the exposed via structure 130 and the protection layer pattern structure 202. The seed layer may directly contact the conductive layer pattern 136 of via structure 130.

The seed layer, for example, may be formed to include copper, and may be formed by a physical vapor deposition (PVD) process.

Then, a second photoresist pattern may be formed to have an opening exposing at least a portion of the seed layer on the top surface of via structure 130, and a pad may be formed to include a first conductive layer pattern 244 and a second conductive layer pattern 246 which fill the opening.

In exemplary embodiments, an electroplating process may be performed to form a second conductive layer on the seed layer to fill the opening and an upper portion of the second conductive layer may be partially removed to form the first conductive layer pattern 244. In this manner, in accordance with principles of inventive concepts, the first conductive layer pattern 244 may be formed to partially fill the opening. Then, an electroplating process may be performed to form a third conductive layer on the first conductive layer pattern 244 to completely fill the opening and the third conductive layer may be planarized to form the second conductive layer pattern 246. As a result, the second conductive layer pattern 246 may be formed on the first conductive layer pattern 244 to fill the remaining portion of the opening.

When the electroplating process is performed, the seed layer may be used as an electrode for forming the first and/or the second conductive layer patterns 244, 246. The first and second conductive layer patterns 244 and 246 may be formed to include metal. Examples of the metal may be nickel (Ni), gold (Au), etc.

Then, the second photoresist pattern may be removed and, then, the exposed portion of the seed layer may be removed to form a seed layer pattern 242. In accordance with principles of inventive concepts, the seed layer pattern 242, the first conductive layer pattern 244 and the second conductive layer pattern 246 may form the pad structure 240.

The second photoresist pattern, for example, may be removed by performing a wet etching process. The exposed portion of the seed layer may be removed using the first and second conductive layer patterns 244 and 246 as an etching mask by an anisotropic etching process.

Referring to FIGS. 16 and 17, the substrate 100 may be divided along the scribe lane region II to form an individual semiconductor device.

The substrate 100 may be cut along the scribe lane region II dividing a plurality of the die regions I. A cutting region CR of the scribe lane region II may be removed, for example, by a sawing process, and a scribe region SR remaining after removing the cutting region CR may be a peripheral region surrounding the die region I of the individual semiconductor device.

Accordingly, the protection layer pattern structure 202 may surround the sidewall of the portion of via structure 130 exposed from the second surface 104 of the substrate 100. Additionally, by the sawing process, the protection layer pattern structure 202 may have a scribe lane recess 204 formed along the scribe region SR of the substrate 100, and a protruding portion 206 covering a portion of the scribe region SR adjacent to the outermost via structure 130a.

Then, the handling substrate 180 and the adhesion layer 170 may be removed to form a semiconductor device such as the exemplary embodiment of semiconductor device 10 in FIG. 10.

Figure 20:
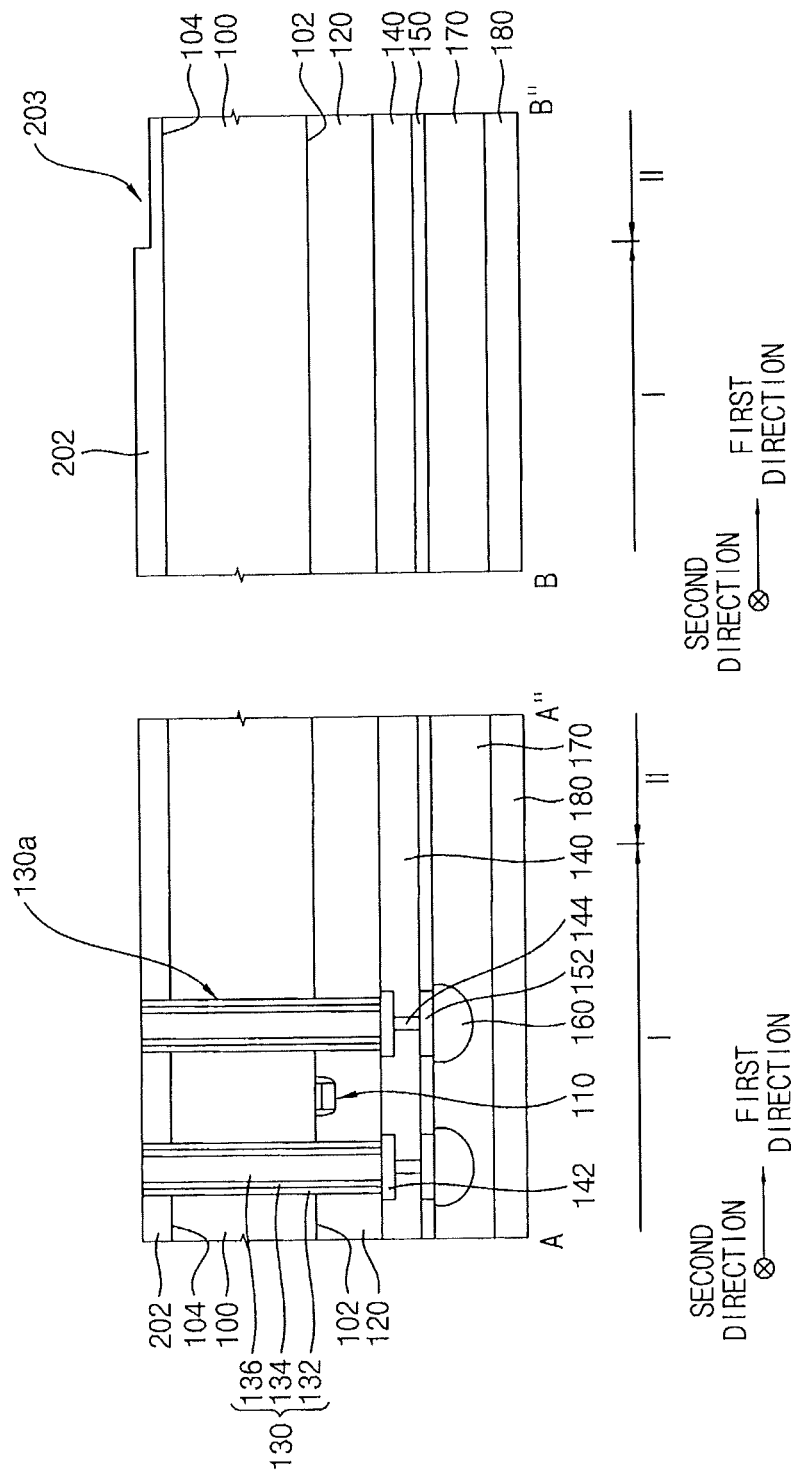
Figure 21:
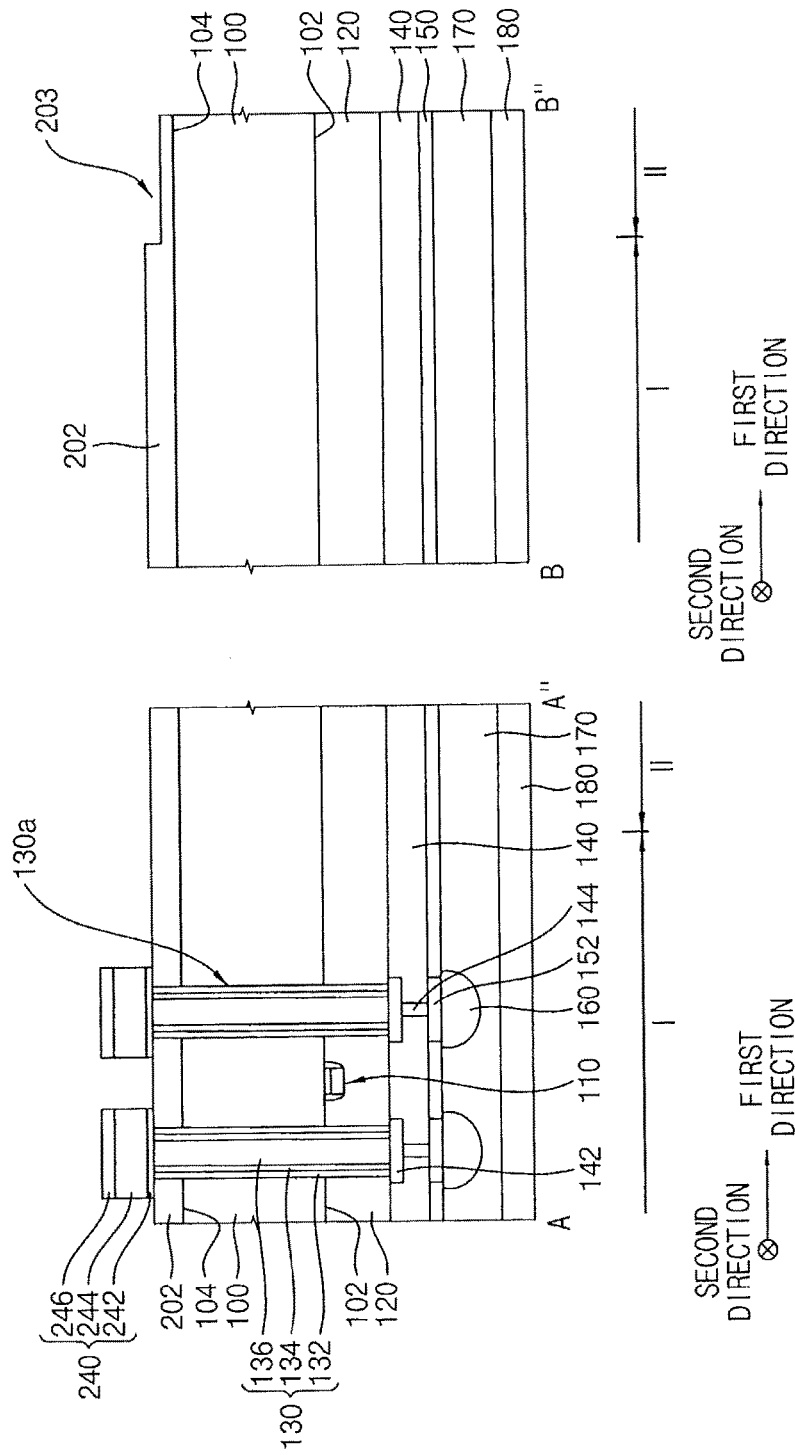
Figure 22:
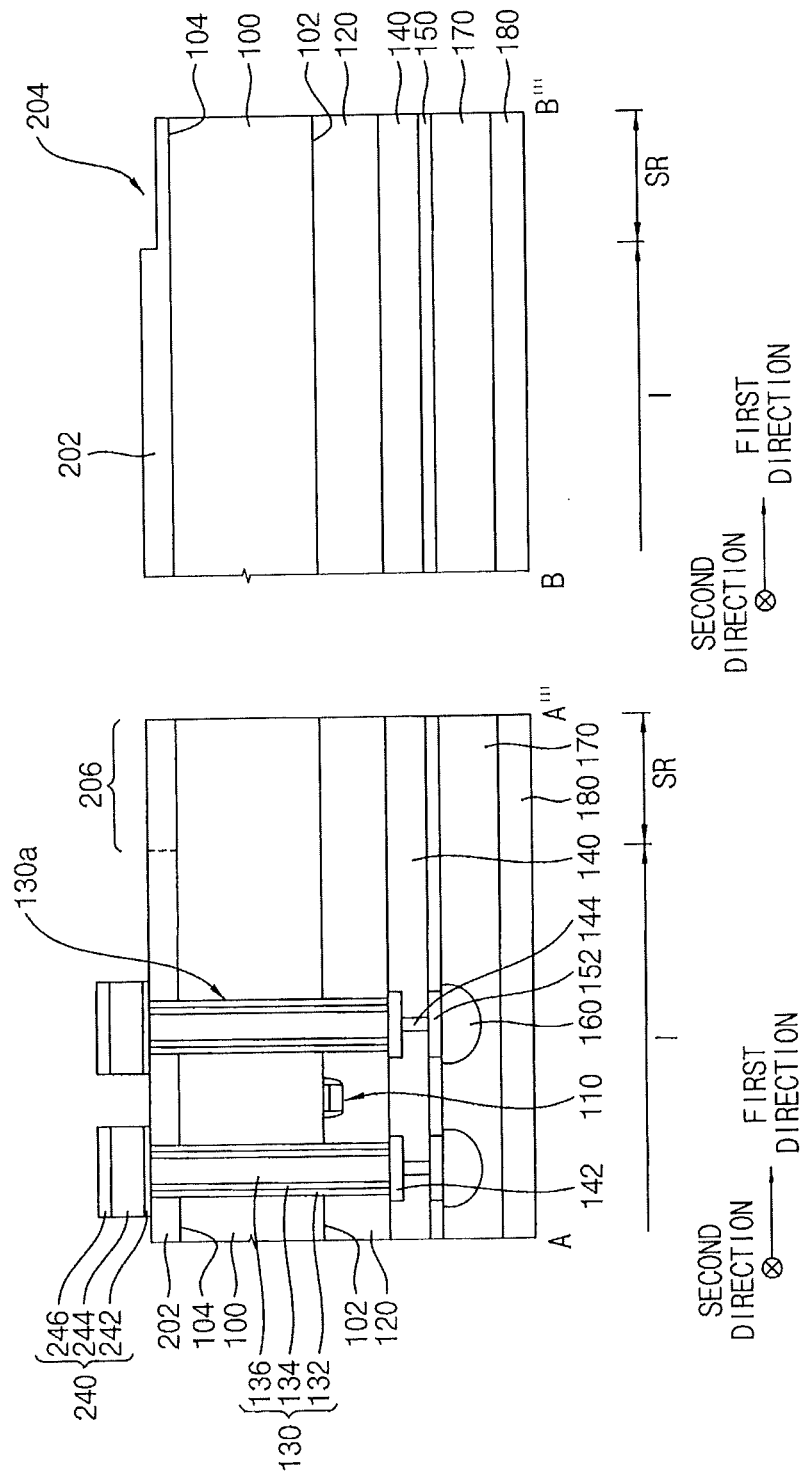

FIGS. 18 to 22 are cross-sectional views illustrating a method of manufacturing a semiconductor device in accordance with exemplary embodiments. The method may include processes substantially the same as or similar to the processes as described with reference to FIGS. 6 to 17, and thus, detailed descriptions thereon will not be repeated here. FIGS. 18 to 21 include cross-sections cut along lines A-A" and B-B" in FIG. 6. FIG. 22 includes cross-sections cut along lines A-A''' and B-B''' in FIG. 16.

First, processes described with reference to FIGS. 6 to 8 may be performed.

Figure 18:
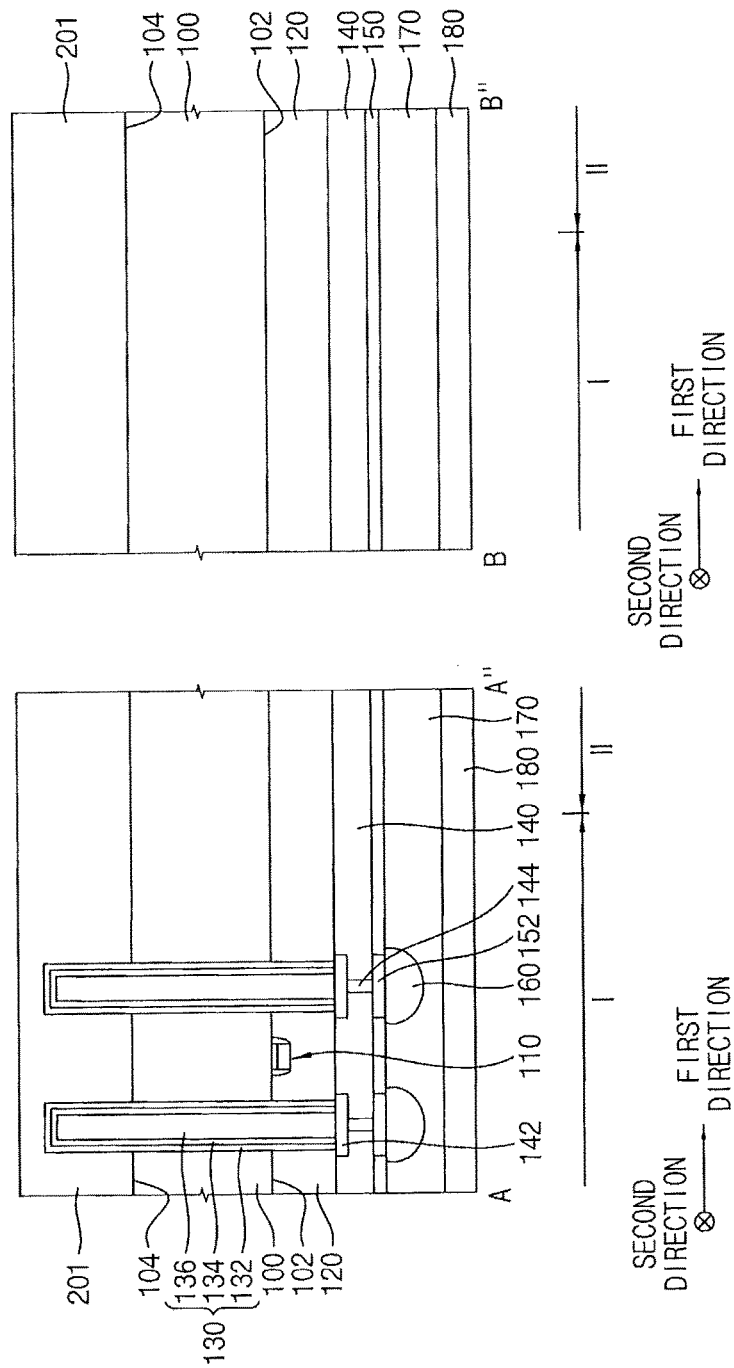

Then, referring to FIG. 18, a protection layer structure 201 may be formed on a second surface 104 of a substrate 100 and an exposed portion of a via structure 130.

In exemplary embodiments, a photosensitive organic insulating material may be dissolved in a solvent to form a compound, the compound may be coated on the second surface 104 of the substrate 100 by, for example, spin on coating, to form a preliminary protective layer, and the substrate 100, upon which the preliminary protecting layer is formed, may be soft-baked to form the protection layer structure 201.

The compound may include a thermosetting organic polymer and a photosensitive material, for example. The thermosetting organic polymer may be a thermosetting resin having an insulating characteristic, for example, polyimide, novolac, polybenzoxazole, benzocyclobutene, silicon polymer, epoxy polymer or acrylate polymer. The photosensitive material may be a positive photosensitive material, for example.

The compound may further include a cross linking agent and a curing catalyst.

Figure 19:
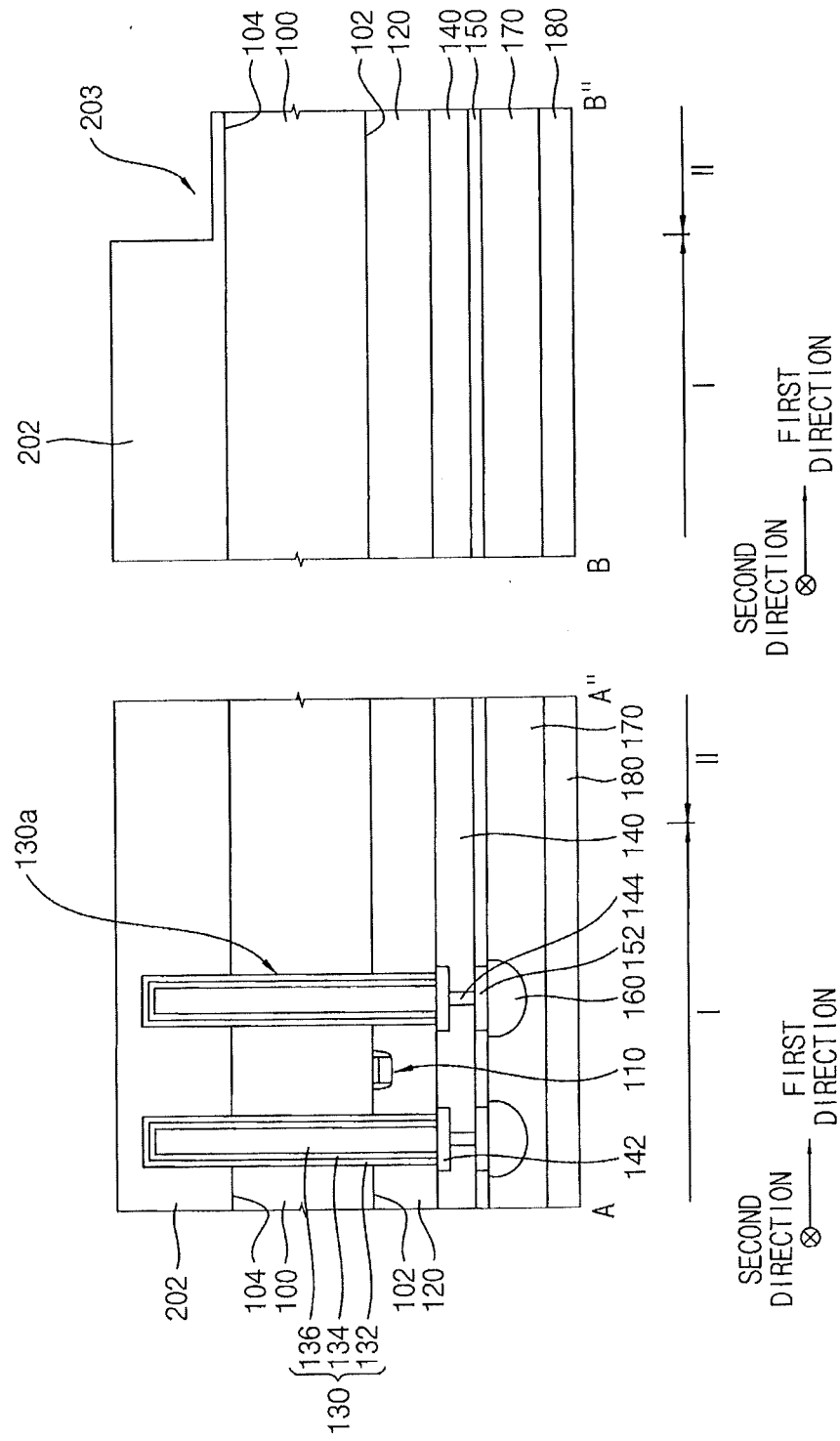

Referring to FIG. 19, an exposure process and a development process may be performed on the protection layer structure 201 to form a protection layer pattern structure 202.

By the exposure process and the development process, a trench 203 for forming a scribe lane may be formed in the protection layer structure 201. The trench 203 for forming a scribe lane may be formed in a scribe lane region II except a portion adjacent to the outermost arranged via structure 130a.

Accordingly, the protection layer pattern structure 202 may have the trench 203 for forming a scribe lane which is formed in the scribe lane region II except the portion adjacent to the outermost arranged via structure 130a.

Then, the substrate 100 may be heated to cure the protection layer pattern structure 200.

In exemplary embodiments, the protection layer pattern structure 202 may be cured at a temperature of equal to or greater than about 100° C. However, the temperature may be changed in accordance with a thermosetting organic polymer of the compound.

Referring to FIG. 20, the protection layer pattern structure 202 may be planarized until a top surface of a conductive layer pattern 136 of via structure 130 may be exposed.

The planarization process may be performed by, for example, a chemical mechanical polishing (CMP) process. In exemplary embodiments, an upper portion of the trench 203 for forming a scribe lane may be partially removed.

The protection layer pattern structure 202 may cover a portion of the scribe lane region II adjacent to the outermost via structure 130a. Accordingly, the protection layer pattern structure 202 may prevent an upper portion of the outermost via structure 130a exposed from the second surface 104 of the substrate 100 from bending or falling down when the upper portions of via structures 130 are removed by the CMP process. Because, in exemplary embodiments in accordance with principles of inventive concepts, via structure 130 does not bend or fall down by the CMP process, via structure 130 may have excellent physical characteristics, particularly when compared to characteristics of a device including via structures that are susceptible to bending or falling down.

Referring to FIGS. 21 and 22, a pad structure 240 may be formed on via structure 130, and the substrate 100 may be cut along the scribe lane region II to form an individual semiconductor device.

Particularly, processes substantially the same as or similar to those described with reference to FIGS. 15 to 17 may be performed to complete the semiconductor device.

Figure 23:
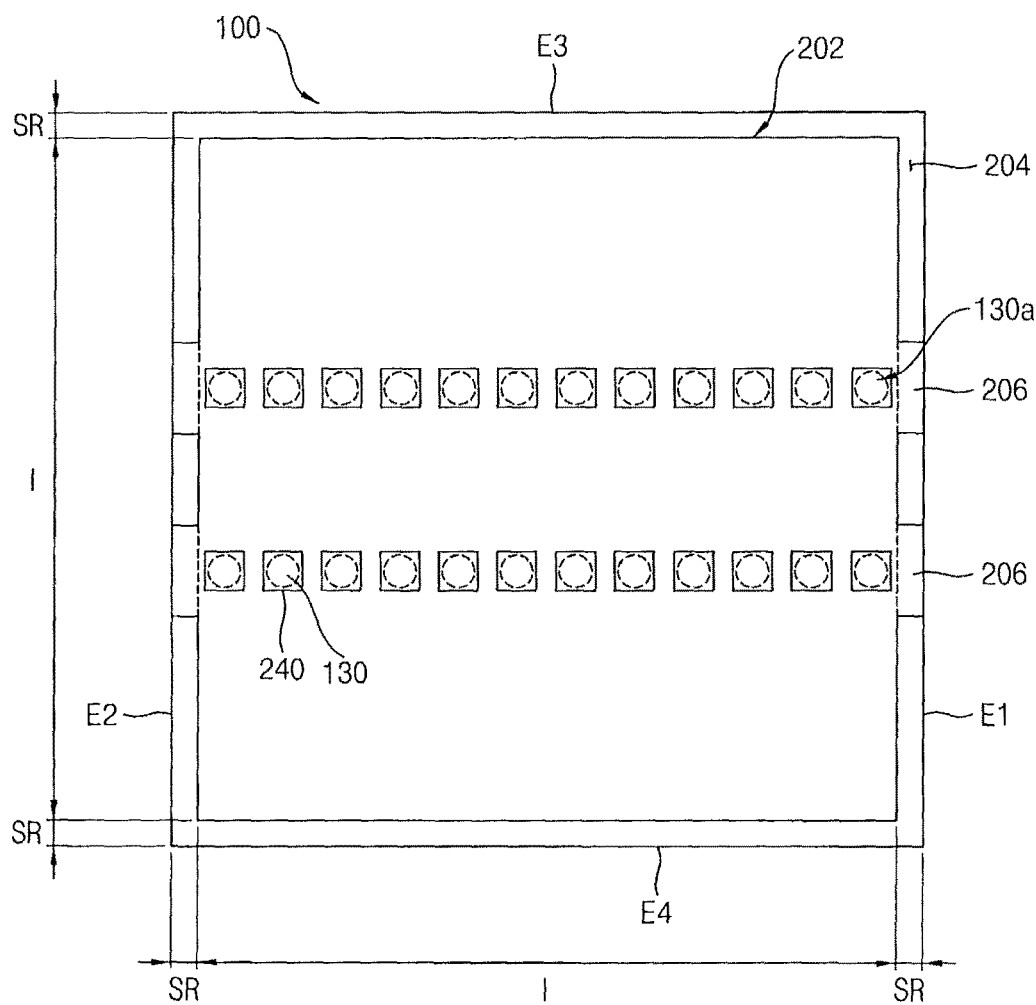

FIG. 23 is a plan view illustrating a semiconductor device in accordance with exemplary embodiments. The semiconductor device may be substantially the same as or similar to the semiconductor device described with reference to FIGS. 1 to 5, except for an arrangement of via structures and a shape of a protection layer pattern structure. Thus, same reference numerals will be used to refer to the same or like elements as those described in the semiconductor device described with reference to FIGS. 1 to 5, and any further repetitive explanation concerning the above elements will not be repeated.

Referring to FIG. 23, a semiconductor device 11 may include a plurality of via structures 130 penetrating through a substrate 100, a protection layer pattern structure 202 and a pad structure 240.

The substrate 100 may include a die region I in which cells are formed and a scribe region SR surrounding the die region I. The substrate 100 may include a first edge E1, a second edge E2 opposite to the first edge E1 and third and fourth edges E3 and E4 adjacent to the first edge E1 and opposite to each other.

Two directions substantially parallel to a top surface of the substrate 100 and substantially crossing each other may be referred to as a first direction and a second direction. For example, the first direction and the second direction may be perpendicular to each other.

The first edge E1 and the second edge E2 may extend in directions parallel to the second direction and the third edge E3 and the fourth edge E4 may extend in directions parallel to the first direction. The scribe region SR may surround the die region I along the edges E1, E2, E3 and E4 of the substrate 100.

A plurality of via structures 130 may be formed in the die region I. Via structure 130 may penetrate the substrate 100, and a portion of via structure 130 may be exposed over the surface of the substrate 100. The protection layer pattern structure 202 may be formed on the surface of the substrate 100 and may surround a sidewall of the portion of via structure 130 exposed from the surface of the substrate 100. The protection layer pattern structure 202 may have a scribe lane recess 204 along the scribe region SR of the substrate 100.

A plurality of via structures 130 may be arranged in one direction along the middle region of the substrate 100. For example, two rows of via columns may be arranged in the second direction and the column may include a plurality of via structures 130 arranged in the first direction. The outermost via structures 130a of the first row of the via column may be arranged closest to the first edge E1 and the second edge E2 respectively. The outermost via structures 130a of the second row of the via column may be arranged closest to the first edge E1 and the second edge E2 respectively.

In exemplary embodiments in accordance with principles of inventive concepts, the protection layer pattern structure 202 may include a plurality of protruding portions 206 covering portions of the first and second edges E1 and E2 adjacent to the outermost via structures 130a respectively. The protruding portions 206 may be spaced apart from each other in the second direction along an extending direction of the scribe region SR. A plurality of the scribe lane recesses 204 may be formed between the protruding portions 206.

Figure 24:
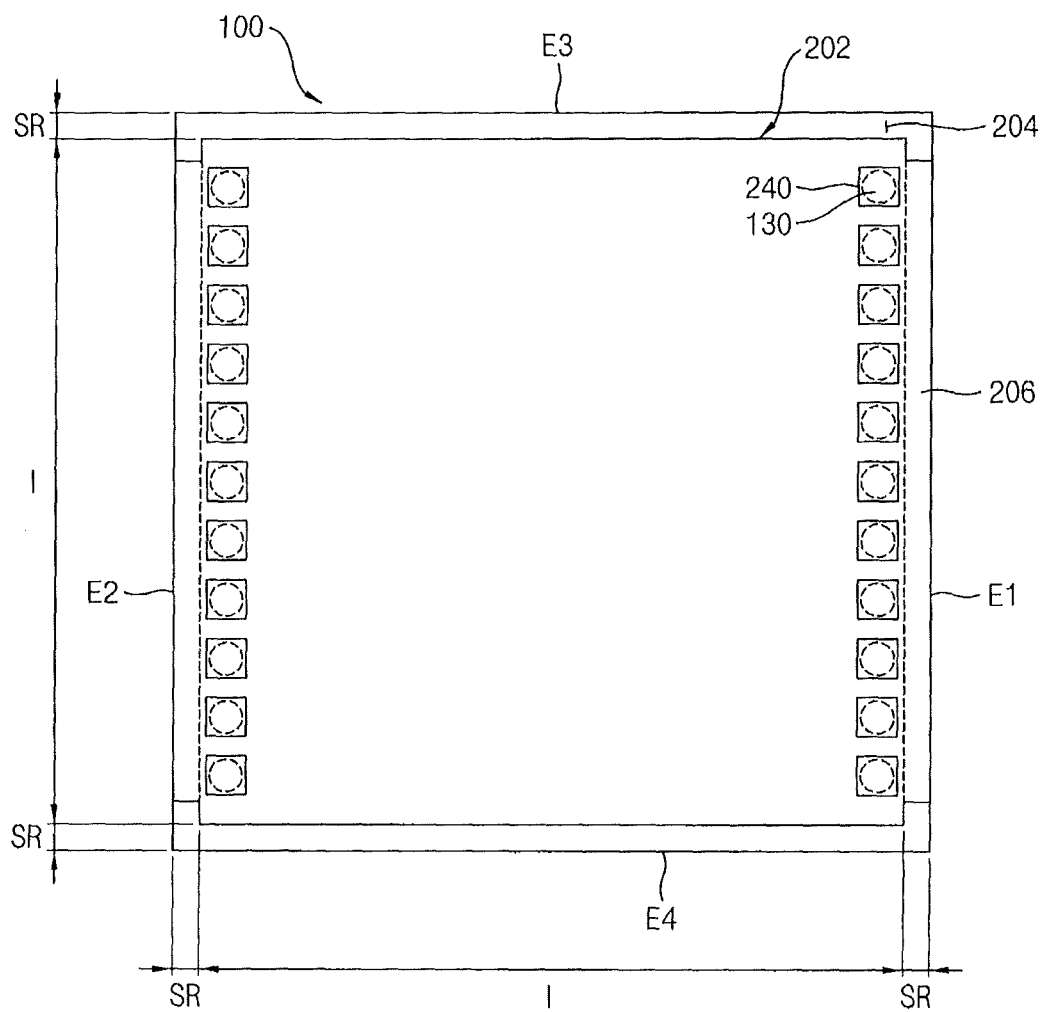

FIG. 24 is a plan view illustrating a semiconductor device in accordance with exemplary embodiments. The semiconductor device may be substantially the same as or similar to the semiconductor device described with reference to FIG. 23, except for an arrangement of via structures and a shape of a protection layer pattern structure. As a result, same reference numerals will be used to refer to the same or like elements as those described in the semiconductor device described with reference to FIG. 23, and any further repetitive explanation concerning the above elements will not be repeated here.

Referring to FIG. 24, a semiconductor device 12 may include a plurality of via structures 130 penetrating through a substrate 100, a protection layer pattern structure 202 and a pad structure 240.

A plurality of via structures 130 may be arranged in one direction along a peripheral region of the substrate 100. For example, two rows of via columns may be arranged in the first direction and the column may include a plurality of via structures 130 arranged in the second direction. Via structures 130 of the first row of via column may be arranged in the second direction adjacent to a first edge E1. Via structures 130 of the second row of the via column may be arranged in the second direction adjacent to a second edge E2.

The protection layer pattern structure 202 may include a plurality of protruding portions 206 covering portions of the first and second edges E1 and E2 adjacent to the first and second rows of via structures 130 respectively. The protruding portions 206 may extend in the second direction to cover most of the first and second edges E1 and E2. That is, the protruding portions 206 may extend to cover portions of a scribe region SR corresponding to the first and second edges E1 and E2, respectively. Two scribe lane recesses 204 may extend to cover third and fourth edges E3 and E4, respectively.

Figure 26:
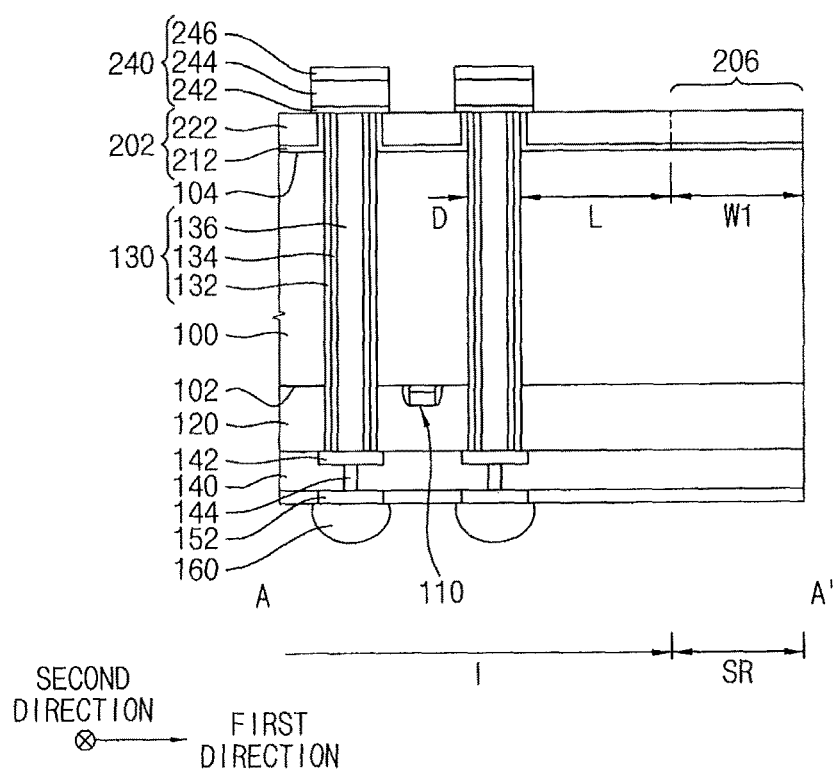
Figure 27:
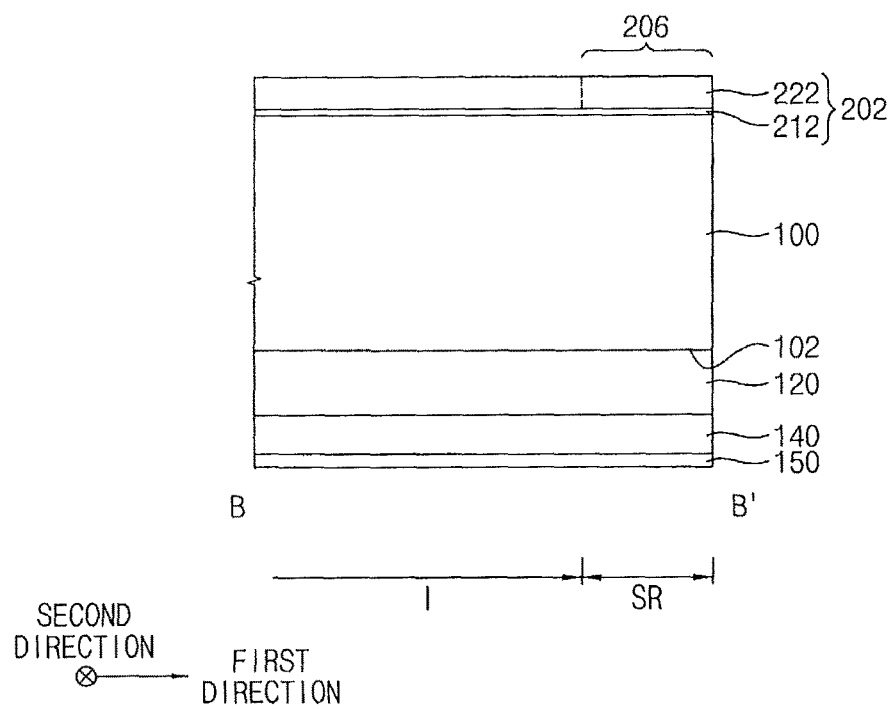
Figure 28:
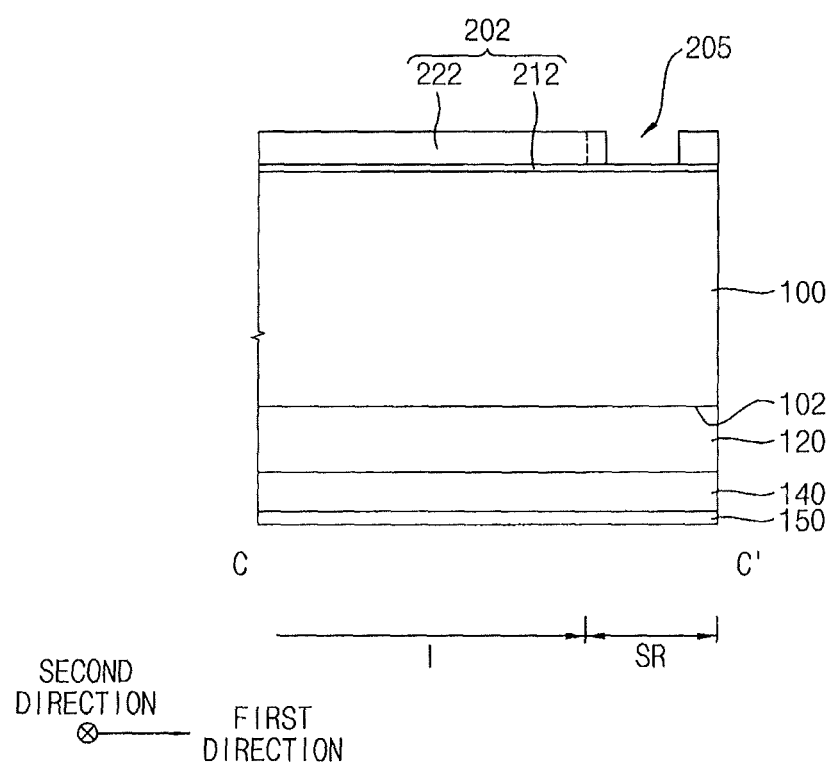

FIG. 25 is a plan view illustrating a semiconductor device in accordance with exemplary embodiments. FIG. 26 is a cross-sectional view taken along the line A-A' in FIG. 25. FIG. 27 is a cross-sectional view taken along the line B-B' in FIG. 25. FIG. 28 is a cross-sectional view taken along the line C-C' in FIG. 25. The semiconductor device may be substantially the same as or similar to the semiconductor device described with reference to FIGS. 1 to 5, except for a shape of a protection layer pattern structure and an arrangement of an alignment key. As a result, same reference numerals will be used to refer to the same or like elements as those described in the semiconductor device described with reference to FIGS. 1 to 5, and any further repetitive explanation concerning the above elements will not be repeated here.

Referring to FIGS. 25 to 27, a semiconductor device 13 may include a plurality of via structures 130 penetrating through a substrate 100, a protection layer pattern structure 202 and a pad structure 240.

The substrate 100 may include a die region I in which cells are formed and a scribe region SR surrounding the die region I. The substrate 100 may include a first edge E1, a second edge E2 opposite to the first edge E1 and third and fourth edges E3 and E4 adjacent to the first edge E1 and opposite to each other. The scribe region SR may surround the die region I along the edges E1, E2, E3 and E4 of the substrate 100.

A plurality of via structures 130 may be formed in the die region I. Via structure 130 may penetrate the substrate 100, and a portion of via structure 130 may be exposed over a second surface 104 of the substrate 100. The protection layer pattern structure 202 may be formed on the second surface 104 of the substrate 100 and may surround a sidewall of a portion of via structure 130 exposed from the second surface 104 of the substrate 100.

The protection layer pattern structure 202 may include a protruding portion 206 covering portions of the first and second edges E1 and E2 adjacent to the outermost via structures 130a as well as the third and fourth edges E3 and E4. That is, the protruding portion 206 of the protection layer pattern structure 202 may cover portions of a scribe region SR corresponding to the first to fourth edges E1, E2, E3 and E4. Accordingly, a scribe lane recess may not be formed in the protection layer pattern structure 202.

The protection layer pattern structure 202 may include an alignment key 205 in the scribe region SR. For example, a plurality of the alignment keys 205 may be formed in corners of the scribe region SR. Accordingly, the protruding portion 206 may cover the most of the scribe region SR and the alignment keys 205 may be formed in the corners.

Hereinafter, an exemplary method of manufacturing the semiconductor device in FIG. 25 will be explained.

Figure 33:
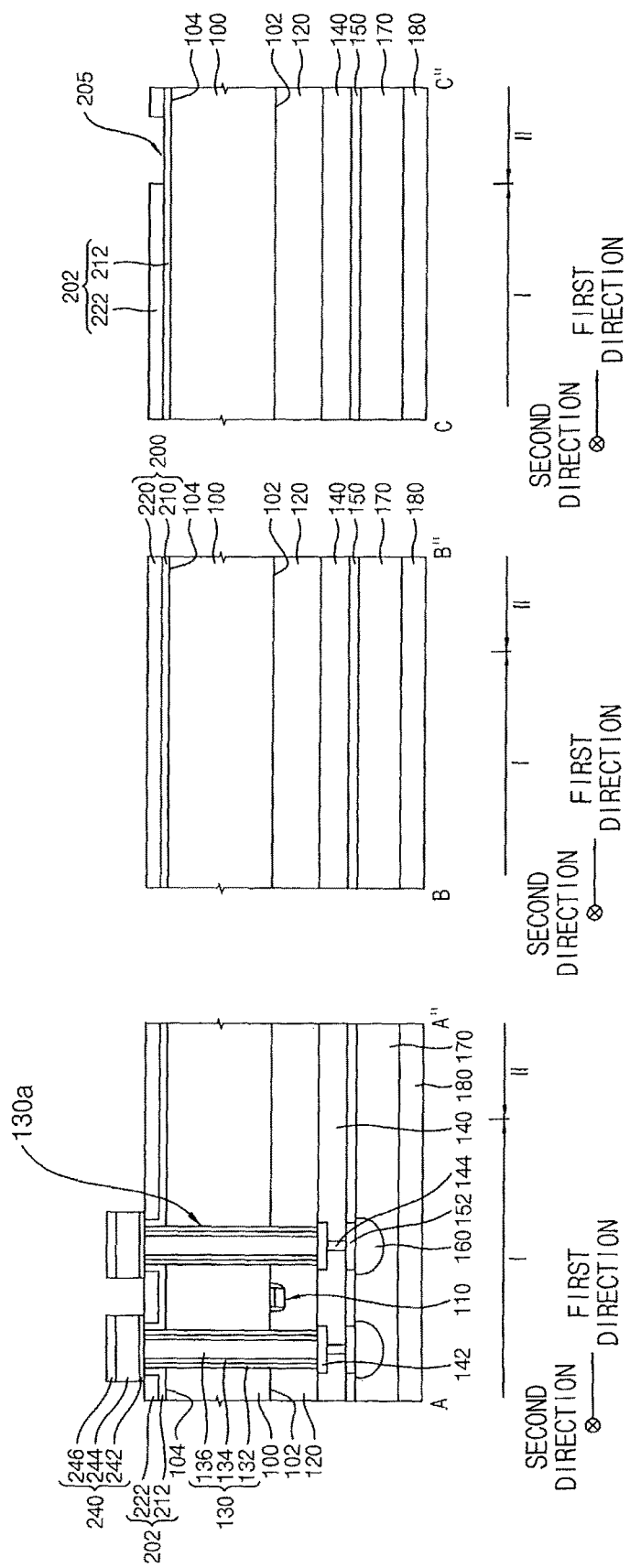
Figure 34:
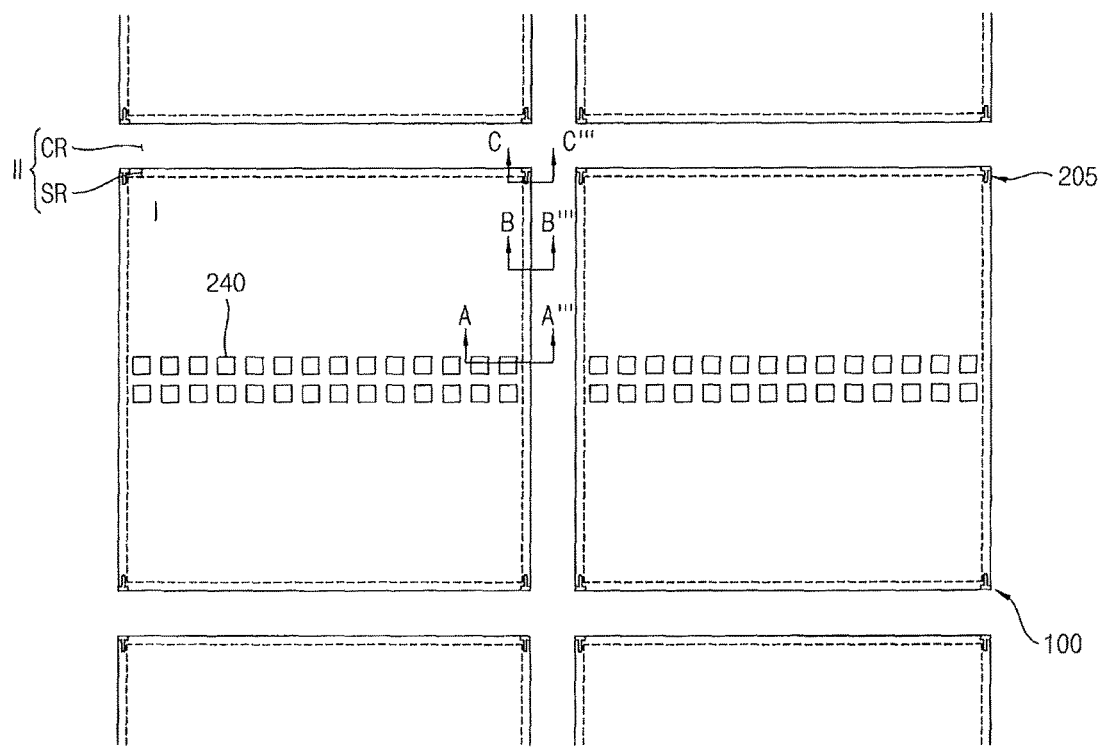
Figure 35:
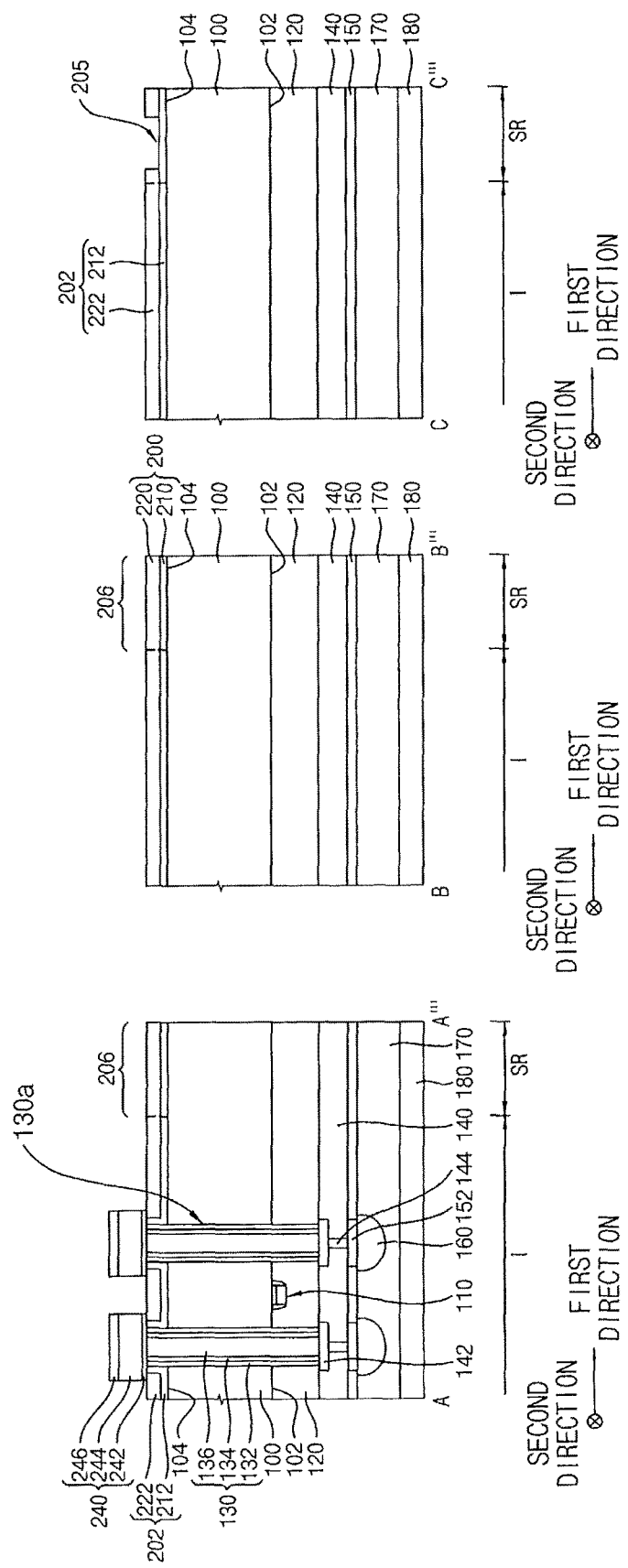

FIG. 29 and FIG. 34 are plan views illustrating a method of manufacturing a semiconductor device in accordance with exemplary embodiments. FIGS. 30 to 33 and FIG. 35 are cross-sectional views illustrating the method of manufacturing a semiconductor device in accordance with exemplary embodiments. FIGS. 30 to 33 include cross-sections cut along lines A-A", B-B" and C-C" in FIG. 29. FIG. 35 includes cross-sections cut along lines A-A''', B-B''' and C-C''' in FIG. 35.

Referring to FIG. 29, a substrate 100, such as wafer W having a die region I and a scribe lane region II surrounding the die region I, may be prepared. Then, processes described with reference to FIGS. 6 to 10 may be performed to form a photoresist layer on a second surface 104 of the substrate 100 to cover a protection layer structure 200.

Figure 30:
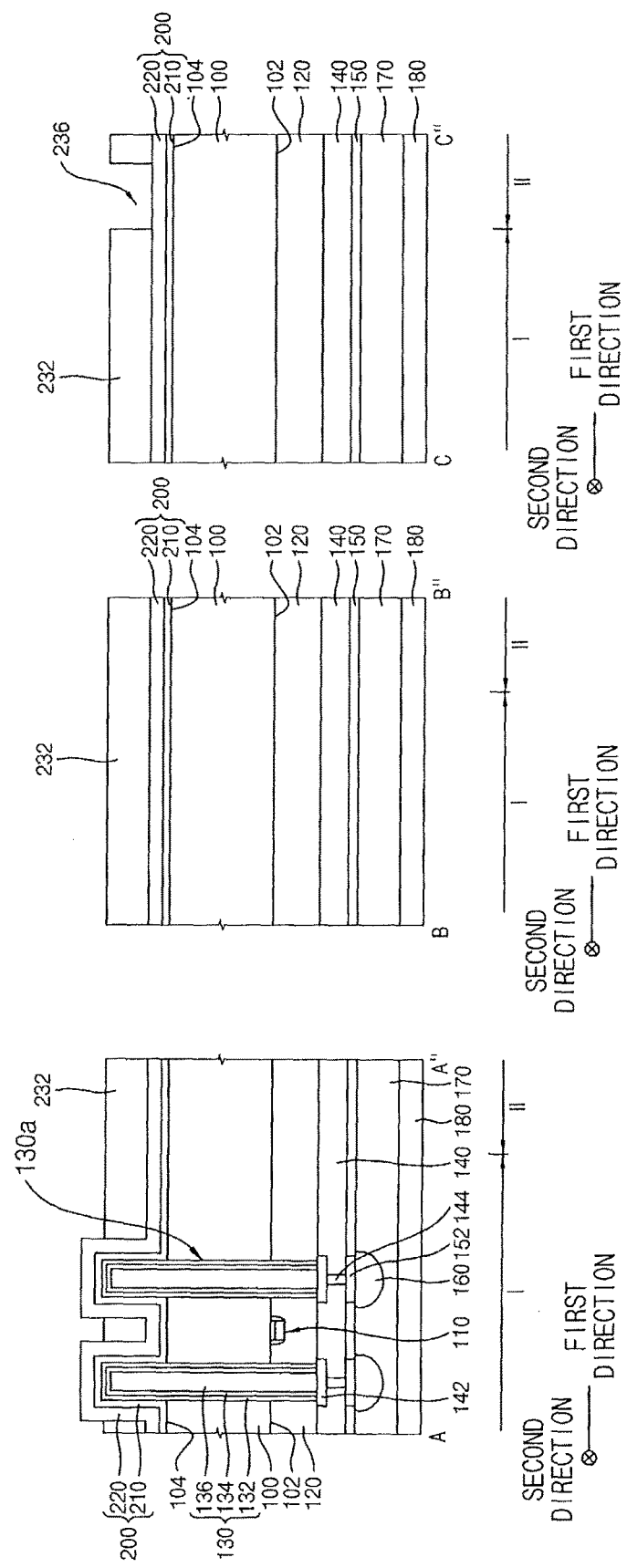

Referring to FIG. 30, the photoresist layer may be patterned by an exposure process and a development process to form a photoresist pattern 232 on the protection layer structure 200.

In exemplary embodiments, the photoresist pattern 232 may be formed to have an opening 236 for forming an alignment key. The photoresist pattern 232 may cover the entire portion of the scribe lane region II adjacent to the outermost via structure 130a. A plurality of the openings 236 may be formed in corners of the scribe lane region II respectively. Accordingly, an opening for forming a scribe lane may be not formed and only the opening 236 for forming an alignment key may be formed.

When the photoresist layer is etched to form the photoresist pattern 232, the portion of the protection layer structure 200 on via structure 130 may be exposed.

Figure 31:
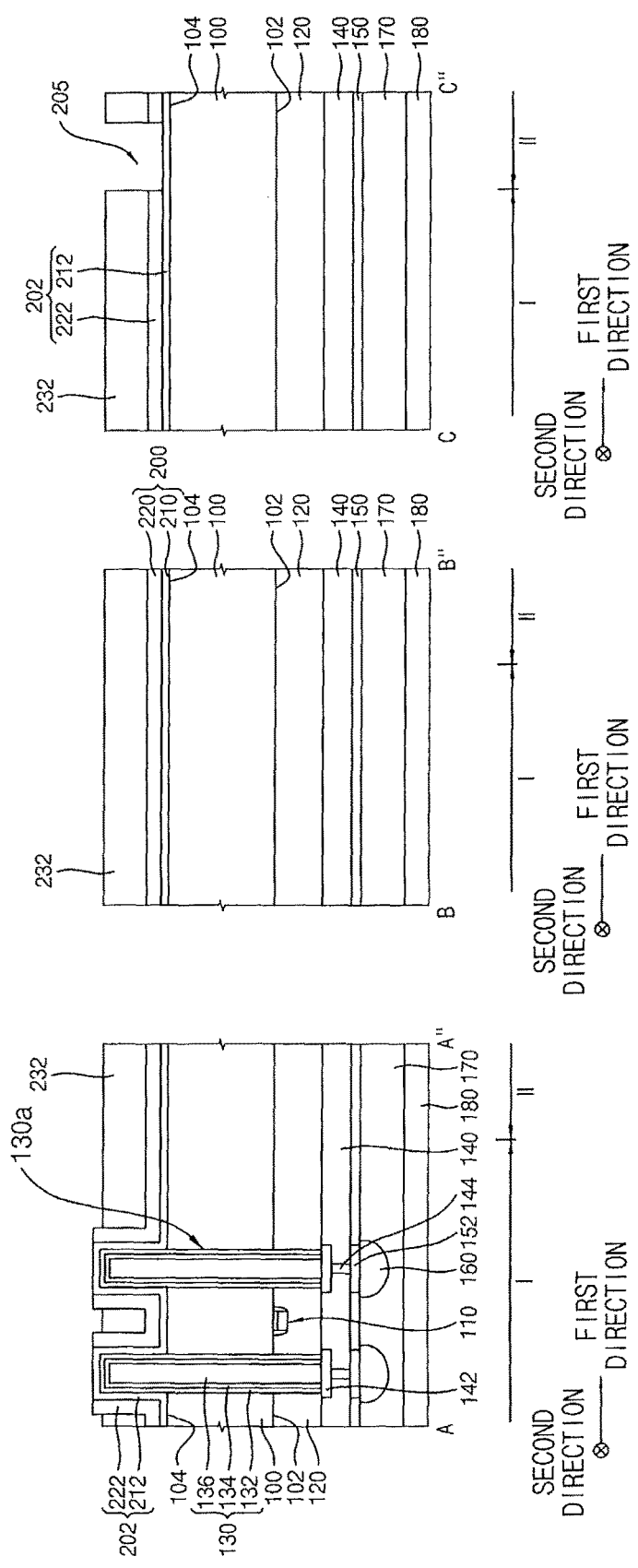

Referring to FIG. 31, the protection layer structure 200 may be etched using the photoresist pattern 232 as an etching mask to form a protection layer pattern structure 202.

In exemplary embodiments, in accordance with principles of inventive concepts, by the etching process, a portion of the protection layer structure 200 exposed by the opening 236 may be etched to form an alignment key 205 in the protection layer pattern structure 202. The alignment key 205 may be formed in a corner of the scribe lane region II, however, it may not be limited thereto. Additionally, by the etching process, the exposed portion of the protection layer structure 200 on via structure 130 may be etched to expose a portion of via structure 130, and the exposed portion of via structure 130 may be also partially etched.

For example, by the etching process, the portion of the protection layer structure 200 exposed by the opening 236 may not be completely removed, and, as a result, the second surface 104 of the substrate 100 may not be exposed. That is, portions of an oxide layer pattern 222 under the opening 236 may be removed, however, a portion of a nitride layer pattern 212 under the opening 236 may remain. Accordingly, the alignment key 205 may be formed in the oxide layer pattern 222 of the protection layer pattern structure 202. Alternatively, the portion of the protection layer structure 200 exposed by the opening 236 may be completely removed. That is, the portions of the oxide layer pattern 222 and the nitride layer pattern 212 under the opening 236 may be removed. Accordingly, the alignment key may be formed in the oxide layer pattern 222 and the nitride layer pattern 212 of the protection layer pattern structure 202.

Accordingly, the protection layer pattern structure 202 may surround a sidewall of the portion of via structure 130 exposed over the second surface 104 of the substrate 100. Additionally, the protection layer pattern structure 202 may have the alignment key which is formed in the corner of the scribe lane region II.

Figure 32:
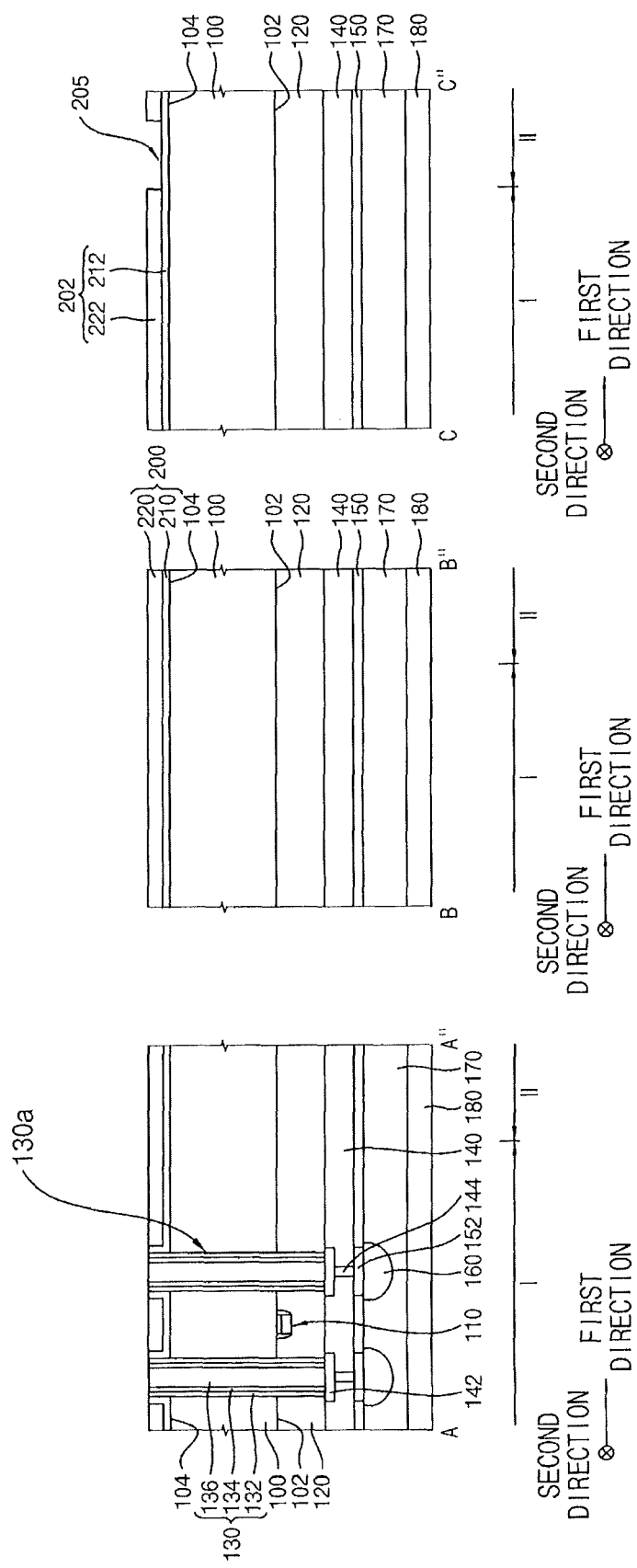

Referring to FIG. 32, after removing the photoresist pattern 232, the protection layer pattern structure 202 may be planarized until a top surface of the conductive layer pattern 136 of via structure 130 may be exposed.

The planarization process may be performed by, for example, a chemical mechanical polishing (CMP) process. In exemplary embodiments, an upper portion of the alignment key 205 may be removed together.

The protection layer pattern structure 202 may cover a portion of the scribe lane region II adjacent to the outermost via structure 130a. Accordingly, the protection layer pattern structure 202 may prevent the upper portion of the outermost via structure 130a exposed over the second surface 104 of the substrate 100 from bending or falling down when the upper portions of via structures are removed by the CMP process. Because, in accordance with principles of inventive concepts, via structure 130 does not bend or fall down by the CMP process, via structure 130 may have excellent physical characteristics. Additionally, the deposition thickness of the protection layer may be reduced to thereby decrease a CMP process time and reduce production cost.

Referring to FIG. 33, a pad structure 240 may be formed on via structure 130.

A seed layer may be conformally formed on top surfaces of the exposed via structure 130 and the protection layer pattern structure 202. The seed layer may directly contact a conductive layer pattern 136 of via structure 130.

Then, a second photoresist pattern may be formed to have an opening exposing at least a portion of the seed layer on the top surface of via structure 130, and a pad may be formed to include a first conductive layer pattern 244 and a second conductive layer pattern 246, which fill the opening.

Then, the second photoresist pattern may be removed, and then the exposed portion of the seed layer may be removed to form a seed layer pattern 242. In exemplary embodiments, the seed layer pattern 242, the first conductive layer pattern 244 and the second conductive layer pattern 246 may form the pad structure 240.

Referring to FIGS. 34 and 35, the substrate 100 may be divided along the scribe lane region II to form individual semiconductor devices.

The substrate 100 may be cut along the scribe lane region II dividing a plurality of the die regions I. A cutting region CR of the scribe lane region II may be removed, for example, by a sawing process, and a scribe region SR remaining after removing the cutting region CR may be a peripheral region surrounding the die region I of the individual semiconductor device. In exemplary embodiments, the substrate 100 may be cut using the alignment key 205 as a reference point, and a portion of the alignment key 205 may be removed together by the sawing process.

Accordingly, the protection layer pattern structure 202 may surround the sidewall of the portion of via structure 130 exposed over the second surface 104 of the substrate 100. Additionally, by the sawing process, the protection layer pattern structure 202 may have a protruding portion 206 covering at least a portion of the scribe region SR adjacent to the outermost via structure 130a. That is, the protruding portion 206 may cover the portions of the scribe region SR corresponding to four edges of the substrate 100. Additionally, the protective pattern structure 202 may include the alignment key 205 in the scribe region SR of the substrate 100. For example, a plurality of the alignment keys 205 may be formed in the corners of the scribe region SR of the substrate 100. Accordingly, the protruding portion 206 may cover most of the scribe region SR of the substrate 100, and the alignment keys 205 may be formed in the corners of the protruding portion 206.

Then, a handling substrate 180 and an adhesion layer 170 may be removed to form the semiconductor device 13 in FIG. 25.

Figure 36:
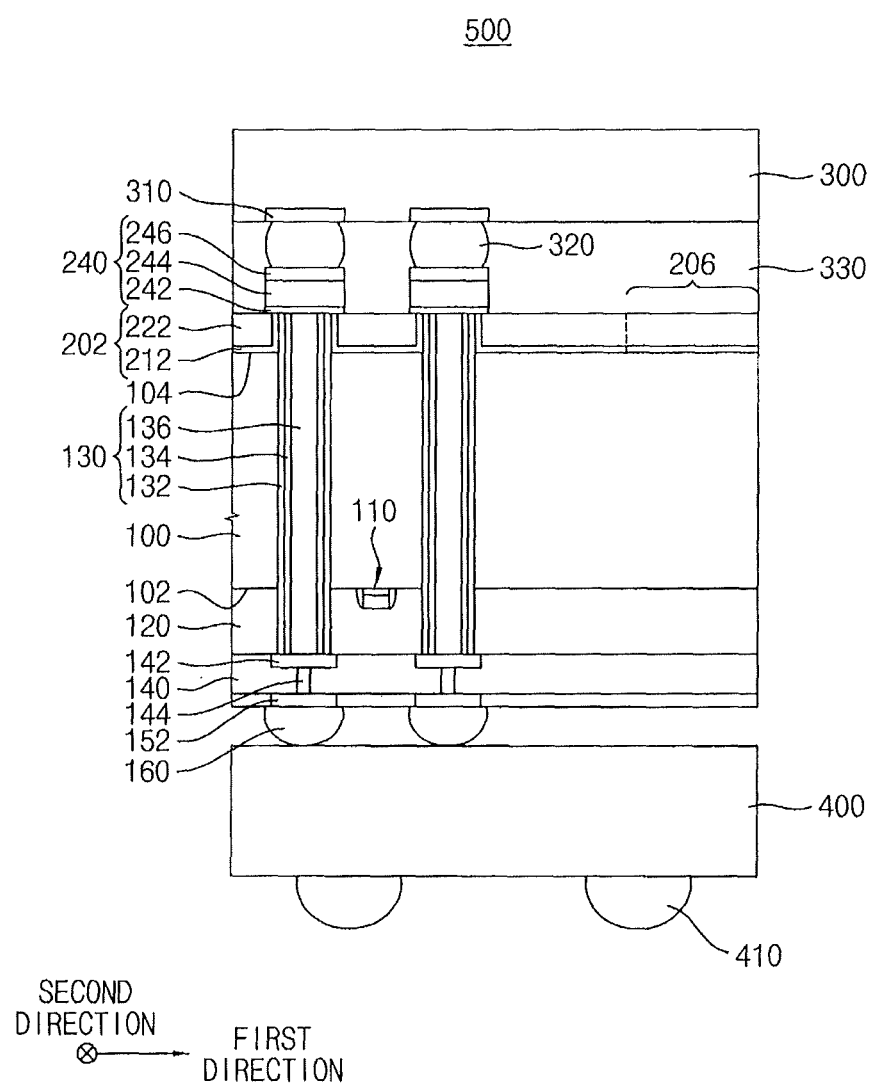

FIG. 36 is a cross-sectional view illustrating a semiconductor package in accordance with exemplary embodiments. The semiconductor package may include an exemplary semiconductor device such as described with reference to FIGS. 1 to 5, 23, 24 and 25. That is, the semiconductor package may include a first semiconductor chip having a semiconductor device in accordance with principles of inventive concepts, such as described in FIGS. 1 to 5, 23, 24 and 25.

Referring to FIG. 36, a semiconductor package 500 may include first and second semiconductor chips sequentially stacked on a package substrate 400. The semiconductor package 500 may further include first and second conductive bumps 160 and 320, a molding member 330, and an external connection terminal 410.

The package substrate 400 may be an insulation substrate on which circuit patterns (not shown) may be printed, for example, a printed circuit board (PCB). The external connection terminal 410 may be formed beneath the package substrate 400, and thus the semiconductor package may be mounted on a module substrate (not shown) via the external connection terminal 410.

The first semiconductor chip may be mounted on the package substrate 400 via the first conductive bump 160, and may have a structure substantially the same as or similar to that of the semiconductor device of FIG. 1, for example.

In an exemplary embodiment, the first semiconductor chip may be a chip having logic devices, for example, a central processing unit (CPU), an application processor (AP), etc.

The second semiconductor chip may include an upper substrate 300 having a conductive pad 310 at a lower portion thereof, and various types of circuit elements (not shown) may be formed on the upper substrate 300. In an exemplary embodiment, the second semiconductor chip may be a chip having a dynamic random access memory (DRAM) device, a static random access memory (SRAM) device, a flash memory device, etc.

The first and second semiconductor chips may be electrically connected to each other by a pad structure, the second conductive bump 320, and the conductive pad 310, and the molding member 330 may be formed between the first and second semiconductor chips. The molding member 330 may include, for example, epoxy molding compound (EMC).

Figure 37:
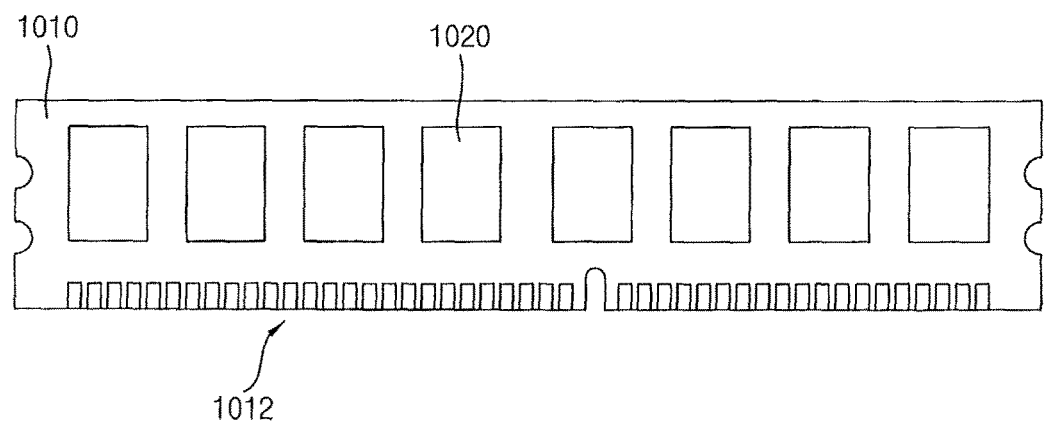

FIG. 37 is a view illustrating an exemplary embodiment of a memory module including a semiconductor device in accordance with exemplary embodiments.

Referring to FIG. 37, a memory module 1000 may include a memory module substrate 1010 and a plurality of memory devices 1020 and a plurality of terminals 1012 disposed on the memory module substrate 1010.

The memory device 1020 may be implemented as a semiconductor device in accordance with principles of inventive concepts, such as any one of the semiconductor devices described above or a semiconductor package including the semiconductor device. The terminals 1012 may include a conductive metal. The terminals 1012 may be electrically connected to the memory devices 1020.

Figure 38:
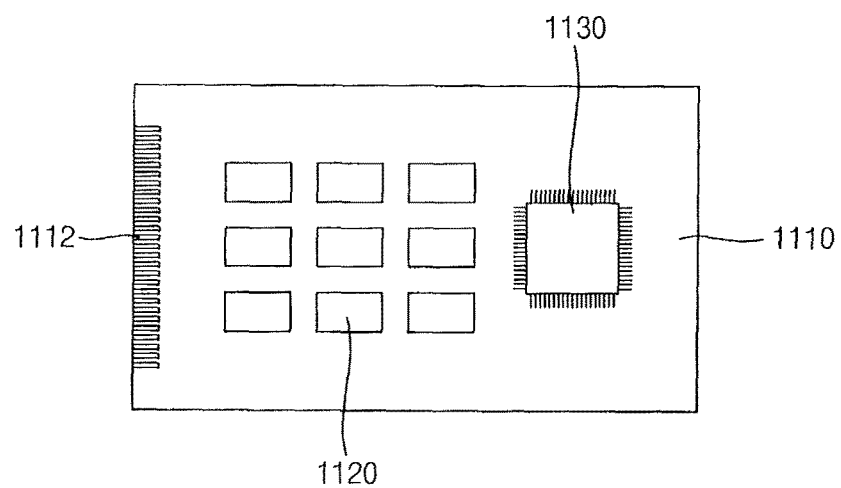

FIG. 38 is a view illustrating a semiconductor module including a semiconductor device in accordance with exemplary embodiments.

Referring to FIG. 38, a semiconductor module 1100 may include a semiconductor device 1120 mounted on a module substrate 1110. The semiconductor device 1120 may be a semiconductor device in accordance with principles of inventive concepts, such as any one of the semiconductor devices described above or a semiconductor package including the semiconductor device.

The semiconductor module 1110 may further include a microprocessor (MP) 1130 mounted on the module substrate 1110. I/O terminals 1112 may be disposed on at least one side of the module substrate 1110.

Figure 39:
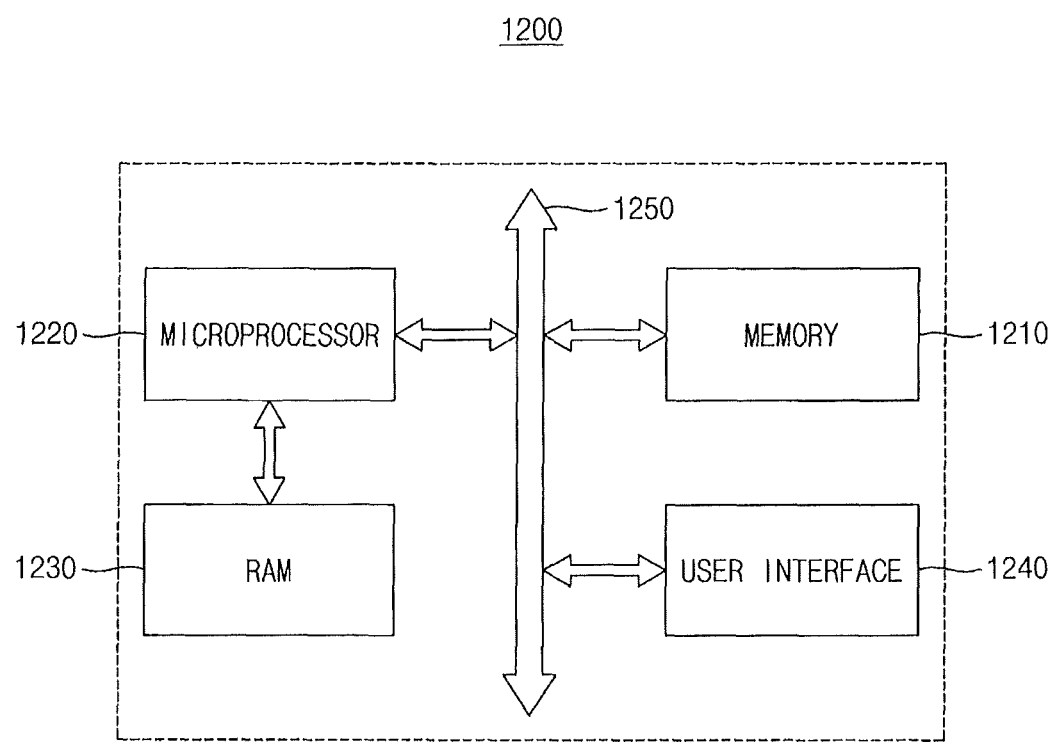

FIG. 39 is a block diagram illustrating an electronic system including a semiconductor device in accordance with exemplary embodiments.

Referring to FIG. 39, an electronic system 1200 may include a semiconductor device in accordance with principles of inventive concepts, such as a semiconductor device as described above. The electronic system 1200 may be used to fabricate a mobile device or computer. For example, the electronic system 1200 may include a memory system 1210, a microprocessor (MP) 1220, a random access memory (RAM) 1230, and a user interface 1240, which may communicate data using a bus 1250. The MP 1220 may program and control the electronic system 1200. The RAM 1230 may be used as an operation memory of the MP 1220. The MP 1220, the RAM 1230, and/or other elements may be assembled within a single package. For instance, the MP 1220, the memory system 1210, and/or the RAM 1230 may include the semiconductor device describe above. The user interface 1240 may be used to input data to the electronic system 1200 or output data from the electronic system 1200.

The memory system 1210 may store codes for operating the MP 1220, data processed by the MP 1220, or external input data. The memory system 1210 may include a controller and a memory for example.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages of the present inventive concepts. Accordingly, all such modifications are intended to be included within the scope of exemplary embodiments as defined in the claims.

What is claimed is:

1. A semiconductor device, comprising:
   a substrate including a die region and a scribe region surrounding the die region;
   a plurality of via structures penetrating through the substrate in the die region, a portion of the via structure being exposed over a surface of the substrate; and
   a protection layer pattern structure on the surface of the substrate surrounding a sidewall of the exposed portion of the via structure and having a protruding portion covering at least a portion of the scribe region adjacent to the via structure.

2. The semiconductor device of claim 1, wherein the protection layer pattern structure has a scribe lane recess along the scribe region of the substrate.

3. The semiconductor device of claim 2, wherein the protruding portion has a width substantially the same as a width of the scribe lane recess.

4. The semiconductor device of claim 2, wherein the protruding portion protrudes in a first direction from the via structure and the scribe lane recess extends in a second direction substantially perpendicular to the first direction.

5. The semiconductor device of claim 1, wherein the protruding portion protrudes in a first direction from the via structure and the protruding portion is spaced apart from the outermost via structure by a distance less than or equal to ten times the diameter of the via structure.

6. The semiconductor device of claim 5, wherein the protruding portion extends in a second direction substantially perpendicular to the first direction by a distance of at least the diameter of the via structure.

7. The semiconductor device of claim 1, wherein the protection layer pattern structure includes a plurality of the protruding portions and the protruding portions are spaced apart from each other along the scribe region.

8. The semiconductor device of claim 1, wherein the protection layer pattern structure comprises a nitride layer pattern and an oxide layer pattern sequentially stacked on the surface of the substrate.

9. The semiconductor device of claim 1, wherein the protection layer pattern structure comprises a photosensitive organic insulating material.

10. The semiconductor device of claim 1, wherein the via structure comprises a via electrode.

11. The semiconductor device of claim 1, further comprising a pad structure making contact with a top surface of the exposed portion of the via structure.

12. The semiconductor device of claim 1, wherein a plurality of the via structures are arranged in one direction along a middle region or a peripheral region of the substrate.

13. A semiconductor device, comprising:
    a substrate having a first surface and a second surface opposite to the first surface;
    a plurality of via structures penetrating through the substrate, a portion of the via structure being exposed over the first surface of the substrate; and
    a protection layer pattern structure provided on the first surface of the substrate, the protection layer pattern surrounding a sidewall of the exposed portion of the via structure and having a scribe lane recess along at least one of edges of the substrate and a protruding portion covering a portion of the edge of substrate adjacent to the via structure.

14. The semiconductor device of claim 13, wherein the protruding portion has a width substantially the same as a width of the scribe lane recess.

15. The semiconductor device of claim 13, wherein the protruding portion protrudes in a first direction from the via structure and the scribe lane recess extends in a second direction substantially perpendicular to the first direction.

16. The semiconductor device of claim 13, wherein the protruding portion protrudes in a first direction from the via structure and the protruding portion is spaced apart from the outermost via structure by a distance less than or equal to ten times the diameter of the via structure.

17. The semiconductor device of claim 13, wherein the protruding portion extends in a second direction substantially perpendicular to the first direction by a distance of at least the diameter of the via structure.

18. A semiconductor device, comprising:
    a substrate including a die region and a scribe region surrounding the die region;
    a plurality of via structures penetrating through the substrate in the die region, a portion of the via structure projecting through the substrate to be exposed beyond a surface of the substrate; and
    a protection layer pattern structure on the surface of the substrate surrounding a sidewall of the exposed portion of the via structure extending into the scribe region adjacent to the via structure substantially the width of the scribe region and extending in a direction perpendicular to that, in the direction of the scribe region, beyond the via structure without filling the entire scribe region.

19. The semiconductor device of claim 18, wherein the extended portion of the protection layer pattern begins at the edge of the scribe region spaced apart from the outermost edge of the outermost via in the via structure by a distance less than or equal to ten times the diameter of the via structure.

20. The semiconductor device of claim 18, wherein the via structure comprises a via electrode.

* * * * *